United States Patent
Hagiwara

(10) Patent No.: US 7,596,360 B2
(45) Date of Patent: Sep. 29, 2009

(54) BROADCAST RECEIVER AND PROGRAM

(75) Inventor: Kazuaki Hagiwara, Koganei (JP)

(73) Assignee: Casio Computer Co., Ltd., Tokyo (JP)

( * ) Notice: Subject to any disclaimer, the term of this patent is extended or adjusted under 35 U.S.C. 154(b) by 623 days.

(21) Appl. No.: 11/354,424

(22) Filed: Feb. 15, 2006

(65) Prior Publication Data
US 2006/0181652 A1 Aug. 17, 2006

(30) Foreign Application Priority Data
Feb. 17, 2005 (JP) ............................. 2005-041125

(51) Int. Cl.
*H04B 1/18* (2006.01)
*H04N 5/50* (2006.01)
(52) U.S. Cl. .............. 455/150.1; 455/154.1; 455/154.2; 455/158.1; 455/160.1; 455/161.1; 455/161.2; 455/179.1; 348/732; 348/731
(58) Field of Classification Search .............. 455/154.1, 455/154.2, 158.1, 150.1, 161.1, 161.2, 179.1, 455/160; 348/731, 732
See application file for complete search history.

(56) References Cited

U.S. PATENT DOCUMENTS

| | | | |
|---|---|---|---|
| 5,280,642 A | 1/1994 | Hirata et al. | |
| 5,303,401 A | 4/1994 | Duckeck et al. | |
| 5,493,709 A * | 2/1996 | Duckeck et al. | ......... 455/185.1 |
| 6,181,921 B1 | 1/2001 | Konisi et al. | |
| 7,174,186 B2 * | 2/2007 | Onodera | ..................... 455/525 |

FOREIGN PATENT DOCUMENTS

| | | |
|---|---|---|
| EP | 0 725 489 A1 | 8/1996 |
| FR | 2685845 A1 | 7/1993 |
| JP | 2003-158686 A | 5/2003 |

* cited by examiner

*Primary Examiner*—Matthew D Anderson
*Assistant Examiner*—Wen W Huang
(74) *Attorney, Agent, or Firm*—Frishauf, Holtz, Goodman & Chick, P.C.

(57) ABSTRACT

A CPU confirms a receivable channel while sequentially changing channel numbers set to an analog front-end unit and specifies an area in which the receivable channel can be received and an area adjacent thereto by referring a receiving channel table by area and an adjacent area table after confirming the receivable channel. After this, the CPU confirms the receivable channel while sequentially setting the channel numbers receivable in the adjacent areas to the front-end unit to specify areas matching with the confirmation result. When the number of specified areas becomes one, the CPU assigns channel numbers to each switch formed of a channel switch group of a user interface unit.

18 Claims, 19 Drawing Sheets

| AREA NAME | BROADCAST STATION (CHANNEL NUMBER) |
|---|---|
| TOKYO | NH-TV (GENERAL) (27ch), NH-TV (EDUCATION) (26ch), N-TV (25ch), TB-TV (22ch), F-TV (21ch), A-TV (24ch), T-TV (23ch), MX-TV (20ch) |
| HOKKAIDO | NH-TV (GENERAL) (15ch), NH-TV (EDUCATION) (13ch), HK1-TV (14ch), HK2-TV (19ch), HK3-TV (21ch), HK4-TV (23ch), HK5-TV (25ch) |
| AOMORI | NH-TV (GENERAL) (16ch), NH-TV (EDUCATION) (13ch), AM1-TV (28ch), AM2-TV (30ch), AM3-TV (32ch) |
| IWATE | NH-TV (GENERAL) (14ch), NH-TV (EDUCATION) (13ch), IW1-TV (16ch), IW2-TV (18ch), IW3-TV (20ch), IW4-TV (22ch) |
| MIYAGI | NH-TV (GENERAL) (17ch), NH-TV (EDUCATION) (13ch), MY1-TV (19ch), MY2-TV (21ch), MY3-TV (24ch), MY4-TV (28ch) |
| AKITA | NH-TV (GENERAL) (15ch), NH-TV (EDUCATION) (13ch), AK1-TV (17ch), AK2-TV (21ch), AK3-TV (29ch) |
| YAMAGATA | NH-TV (GENERAL) (14ch), NH-TV (EDUCATION) (13ch), YM1-TV (8ch), YM2-TV (22ch), YM3-TV (26ch), YM4-TV (32ch) |
| ⋮ | ⋮ |

113

| VIEWING AREA | ADJACENT AREA |
|---|---|
| TOKYO | CHIBA, SAITAMA, YAMANASHI, KANAGAWA |
| HOKKAIDO | AOMORI |
| AOMORI | HOKKAIDO, IWATE, AKITA |
| IWATE | AOMORI, MIYAGI, AKITA |
| MIYAGI | IWATE, AKITA, YAMAGATA, FUKUSHIMA |
| AKITA | AOMORI, IWATE, MIYAGI, YAMAGATA |
| YAMAGATA | MIYAGI, AKITA, FUKUSHIMA, NIIGATA |
| ⋮ | ⋮ |

FIG.10

| GROUP NAME | BROADCAST STATION (CHANNEL NUMBER) |
|---|---|
| N-TV | N1-TV (14ch), N2-TV (30ch), N3-TV (16ch), N4-TV (19ch), N5-TV (26ch) |
| TB-TV | TB1-TV (19ch), TB2-TV (28ch), TB3-TV (18ch), TB4-TV (24ch), TB5-TV (17ch), TB6-TV (8ch) |
| F-TV | F1-TV (23ch), F2-TV (20ch), F3-TV (21ch), F4-TV (21ch), F5-TV (32ch) |
| A-TV | A1-TV (21ch), A2-TV (32ch), A3-TV (22ch), A4-TV (28ch), A5-TV (29ch), A6-TV (22ch) |
| T-TV | T1-TV (25ch), ...... |

902a

BROADCAST RECEIVER AND PROGRAM

CROSS-REFERENCE TO RELATED APPLICATIONS

This application is based upon and claims the benefit of priority from prior Japanese Patent Application No. 2005-041125, filed Feb. 17, 2005, the entire contents of which are incorporated herein by reference.

BACKGROUND OF THE INVENTION

1. Field of the Invention

The present invention relates to a broadcast receiver configured to receive broadcast signals transmitted for each channel and extract a broadcast signal of a channel desired by a user from the received broadcast signals.

2. Description of the Related Art

At the present day, broadcast receivers of a television broadcast are commercially manufactured in large numbers as types premised on moving a setting place thereof as well as types of setting. The latter type includes broadcast receivers such as a portable small broadcast receiver, cellular phone with a broadcast receiving function mounted thereon and an on-vehicle broadcast receiver. Recently, a large number of personal computers with broadcast receiving functions mounted thereon have been commercialized.

Most of the broadcast receivers are configured to assign channel numbers to an operation member for channel specifying (tuning) to view channels of the channel numbers assigned to the operation member operated by the user. However, channels of broadcast signals which can be received by the broadcast receiver are varied depending on the place where the broadcast receiver is. Some of the broadcast receivers, therefore, have functions to assign the channel numbers to the operation member (hereinafter, referred to channel assignment function). Such assignment is equivalent to the setting of the channels of the broadcast signals being objects to be taken out. As it stands now, a broadcast receiver based on the premise of the moving of the setting place frequently has to newly assign the channel numbers in accordance with the moving thereof.

The operation member to assign the channel numbers is mounted on a receiver main body or a remote control device. When the number of the operation members is smaller than that of the channels being objects to be assigned, a channel number with a relatively higher number is usually specified by operating one or more operation members multiple times. A plurality of operation members to change the channel numbers are prepared sometimes at every operation.

A conventional broadcast receiver with the aforementioned channel assignment function mounted thereon is disclosed by, for example, Japanese Patent Application Publication (KOKAI) No. 2003-158686. This patent document discloses a method for specifying channels capable of each receiving broadcast signal to assign them to an operation member while sequentially changing channels to be tuned. The patent document also discloses a method for checking the combination of the channels specified in this way with a combination of the receivable channels prepared by area and for assigning the specified channel to the operation member if the area is one which is matched to the combination of the specified channels.

Any method disclosed by the above-mentioned patent document performs an all station search to confirm whether or not broadcast signals can be received in all channels. However, the time required to search one channel is not a negligible length. The required time, specifically, is one or two seconds per one channel ordinarily. Nowadays, the number of the channels capable of transmitting the broadcast signals is usually in large. A terrestrial digital broadcast, for example, assumes fifty channels for the number of channels. In the days ahead, it is expected that the sales figures of the broadcast receivers based on the premise of the moving of the setting place, so that it is important for the broadcast receiver to further quickly assign the channels, namely, quickly set the channels being objects to extract the broadcast signals.

BRIEF SUMMARY OF THE INVENTION

An object of the present invention is to provide a broadcast receiver capable of easily setting channels to extract broadcast signals therefrom.

According to an embodiment of the present invention, a broadcast receiver comprises:

receiving means for receiving broadcast signals transmitted for each channel;

tuning means for extracting broadcast signals of set channels from the broadcast signals received by the receiving means;

data acquisition means for acquiring channel data for areas indicating channels of the broadcast signals receivable by the receiving means;

first area specifying means for specifying an area in which the tuning means extracts the broadcast signals of all the channels indicated by the channel data by checking channels which the tuning means extracts with channels which is indicated by the channel data acquired by the data acquiring means while changing the channel to be set to the tuning means; and channel setting means, when the area specifying means specifies a single area, for setting the channels indicated by the channel data of the single area.

According to another embodiment of the present invention, a broadcast receiver comprises:

receiving means for receiving broadcast signals transmitted for each channel;

tuning means for extracting broadcast signals of set channels from the broadcast signals received by the receiving means;

data acquisition means for acquiring channel data for areas indicating channels of the broadcast signals receivable by the receiving means and adjacent data indicating an adjacent relationship among areas;

area specifying means, with reference to a first area relating to channel data indicating channels which are extracted by the tuning means and a second area which is adjacent to the first area and which is indicated by the adjacent data, for sequentially setting to the tuning means channels indicated by the channel data of the first area and the second area and for specifying an area in which the tuning means extracts the broadcast signals of all the channels indicated by the channel data of the first area and the second area; and channel setting means for setting channels indicated by the channel data of the first area and the second area when the area specifying means specifies a single area.

According to another embodiment of the present invention, an article of manufacture comprising a computer usable medium having computer readable program code means embodied therein, the computer readable program code means comprises:

computer readable program code means for causing a computer to receive broadcast signals transmitted for each channel;

computer readable program code means for causing a computer to extract broadcast signals of set channels from the received broadcast signals;

computer readable program code means for causing a computer to acquire channel data for areas indicating channels of the receivable broadcast signals;

computer readable program code means for causing a computer to specify an area in which a tuner extracts the broadcast signals of all the channels indicated by the channel data by checking channels which the tuner extracts with channels which is indicated by the acquired channel data while changing the channel to be set to the tuner; and computer readable program code means for causing a computer to, when the single area is specified, set the channels indicated by the channel data of the single area.

According to another embodiment of the present invention, an article of manufacture comprising a computer usable medium having computer readable program code means embodied therein, the computer readable program code means comprises:

computer readable program code means for causing a computer to receive broadcast signals transmitted for each channel;

computer readable program code means for causing a computer to extract broadcast signals of set channels from the received broadcast signals;

computer readable program code means for causing a computer to acquire channel data for areas indicating channels of the broadcast signals receivable by a receiver and adjacent data indicating an adjacent relationship among areas;

computer readable program code means for causing a computer to, with reference to a first area relating to channel data indicating channels which are extracted by a tuner and a second area which is adjacent to the first area and which is indicated by the adjacent data, sequentially set to the tuner channels indicated by the channel data of the first area and the second area and specify an area in which the tuner extracts the broadcast signals of all the channels indicated by the channel data of the first area and the second area; and computer readable program code means for causing a computer to set channels indicated by the channel data of the first area and the second area when a single area is specified.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the present invention and, together with the general description given above and the detailed description of the embodiments given below, serve to explain the principles of the present invention in which:

FIG. 3 is an exemplary view for explaining its adjacent areas specified by an adjacent area table in accordance with areas specified by referring to the receiving channel table by area;

FIG. 10 is an exemplary view for explaining content of a broadcast station group table;

DETAILED DESCRIPTION OF THE INVENTION

An embodiment of a broadcast receiver according to the present invention will now be described with reference to the accompanying drawings.

First Embodiment

Figure 1:
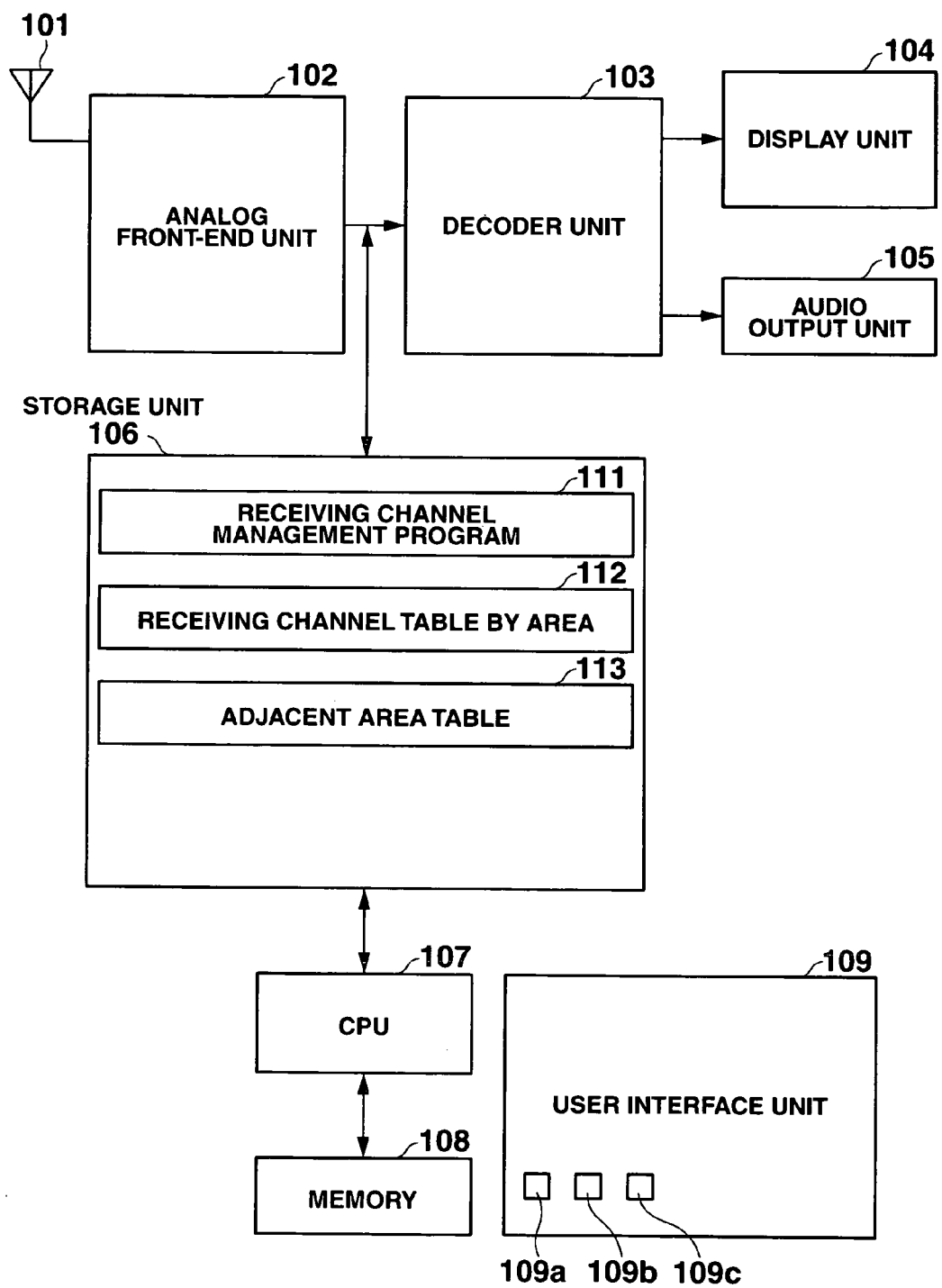
FIG. 1 is an exemplary view for explaining a configuration of a broadcast receiver according to the first embodiment of the present invention.

FIG. 1 is the exemplary view for explaining the configuration of the broadcast receiver according to the first embodiment of the present invention.

A broadcast receiver is a small type one, for example, allowing a user to carry it. The broadcast receiver can receive, for example, broadcast signals of a television broadcast, as a broadcast signal. The broadcast receiver comprises, as shown in FIG. 1, an antenna 101 to receive the broadcast signals, an analog front-end unit (hereinafter, abbreviated as front-end unit) 102 to extract and demodulate a broadcast signal of the set channel among the broadcast signals received through the antenna 101 to output its digital signal, a decoder unit 103 to decode the digital signal and output a video signal and an audio signal, a display unit 104 to display the video signal, an audio output unit 105 to output the audio signal as a sound, a storage unit 106 being a nonvolatile semiconductor memory such as a flash memory, a CPU 107 to execute control of the whole of the broadcast receiver, a memory 108 to be used for work by the CPU 107 and a user interface unit (hereinafter, abbreviated as interface unit) 109 to input an instruction from the user.

The interface unit 109 allows the user to select, for example, a channel desired to be viewed by the user. Here, it is assumed that the interface unit 109 includes an operation member such as a plurality of buttons for tuning and a plurality of buttons for a variety of instructions and a detection circuit to detect operations to the operation member. Hereinafter, each of the buttons for the tuning is called "channel switch". Regarding the channel switches, it is assumed that one channel (channel number) is assigned to each channel switch. The user interface unit 109 has a channel switch group 109a composed of mounted channel switches and a television switch 109b to operate the broadcast receiver as a receiver of a television (TV) broadcast. The TV switch 109b is configured to be a type to vary the state thereof by being operated.

The storage unit 106 stores a program which is executed by the CPU 107 and data for a variety of types of control. Regarding the computer executable program, a receiving channel management program (hereinafter, abbreviated as management program) 111 being a sub-program to automatically assign the channel numbers to each channel switch consisting of the channel switch group 109a is stored. For control data, a receiving channel table by area (hereinafter, abbreviated as channel table) 111 being data for showing, for each area, combinations of the channels possible to receive the broadcast signals and an adjacent area table 113 being data for showing areas adjacent to the area for each all areas showing the combinations of the channels onto the channel table 112 are stored in the storage unit 106. The channel table by area 112 and the adjacent area table 113 include contents, for example, shown in FIG. 3, respectively. Data or the like by which the decoder unit 103 decodes a digital signal is stored in the tables 112 and 113 depending on an encoding method adopted to encoding the digital signal which is demodulated and output by the front-end unit 102.

Operations of the above-described receiver will be explained. It is assumed that transmittable channels of the broadcast signals are 13 to 62 channels. Descriptions are focused on operations for setting a channel to extract a broadcast signal by means of the front-end unit 102.

The user sets the channels, in other words, the user assigns the channel numbers to each channel switch by operating an all station search switch 109c mounted on the user interface unit 109. When the user performs the operation, the interface unit 109 detects the operation to inform the fact to the CPU 107. Whereby, the CPU 107 reads out the management program 111 from the storage unit 106 to run it and assigns the channel numbers to each channel switch, respectively, by referring to the tables 112 and 113.

The CPU 107 which has started the execution of the management program 111, confirms the receivable channels for the broadcast signals while, at first, sequentially changing the channels to be tuned by the front-end unit 102. When confirming the receivable channels, the CPU 107 refers to the channel table 112 to specify the area by which the broadcast receiver can receive the cannels having the channel numbers. Any changing method for channels to be tuned can be used and, in this case, the channel numbers are changed in order of ascending channel numbers. The broadcast receiver can confirm the receivable channels by making the front-end unit 102 input, for example, receiving levels of the broadcast signals. Therefore, the confirmation is equivalent to the confirmation whether or not the front-end unit 102 can extract the broadcast signals.

Figure 2:
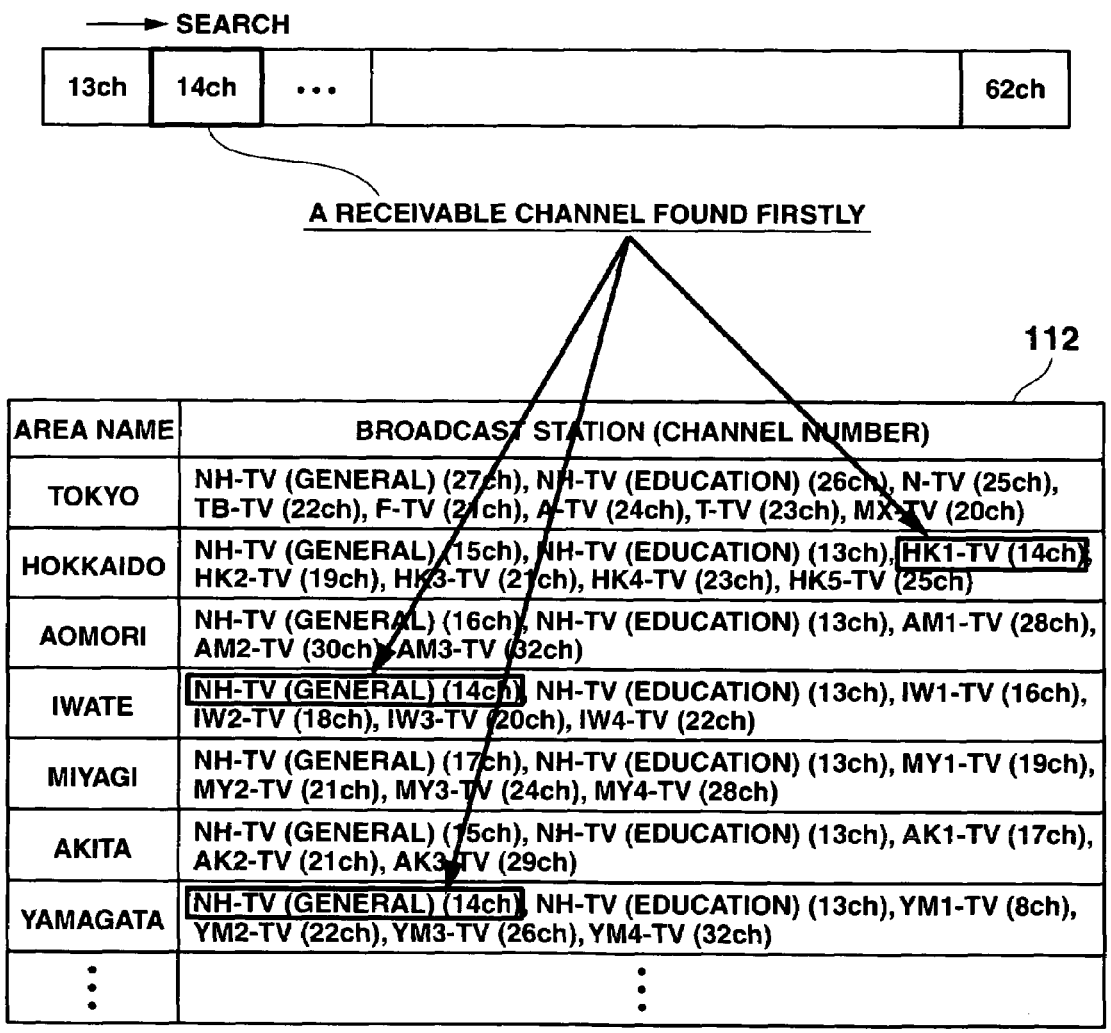
FIG. 2 is an exemplary view for explaining an area specified by referring to a receiving channel table by area when the first channel capable of receiving a broadcast signal (hereinafter, referred to as receivable channel) is confirmed.

FIG. 2 is the exemplary view for explaining the area specified by referring to the channel table 112 when the first receivable channel is confirmed.

In an example shown in FIG. 2, the channel which has firstly been confirmed to be receivable is channel 14 (14ch). Each area called Hokkaido, Iwate and Yamagata in Japan allow the broadcast receiver to receive the channel 14. Thereby, each of the areas is specified. The specified each area is an area in which the broadcast receiver (user) is probably located.

After specifying the areas by referring to the channel table 112, the broadcast receiver specifies areas adjacent to the specified area by referring to the adjacent area table 113, as shown in FIG. 3. After this, the user pays attention only to the areas specified by referring to the channel table 112 and to the adjacent areas specified by referring to the adjacent area table 113, confirms the receivable channels while sequentially setting the channel numbers receivable in those areas to the front-end unit 102 and narrows down areas in which the broadcast receiver is probably located on the basis of the confirmation result. The confirmation of the receivable channels is conducted until the number of the narrowed channels becomes one. Accordingly, the broadcast receiver assigns the channels (channel numbers) which are set as receivable ones in the narrowed area by the channel table 112 to each channel switch.

In this way, the first embodiment takes the adjacent areas other than the areas in which the channels have been confirmed to be receivable into consideration. This is because the fact that the broadcast receiver can receive the broadcast signals of the channels confirmed to be receivable in the adjacent areas occurs depending on, for example, places in the area. Accordingly, the broadcast receiver can securely and highly precisely specify the area in which the broadcast receiver probably located, by considering even the adjacent areas.

By specifying the ranges of the areas in that manner, the channels to be confirmed whether or not the channels are receivable can be decided as only the channels which are respectively receivable in each area. Thereby, the broadcast receiver can further suppress the number of the channels which should be confirmed whether or not they are receivable, by the time when the area where the broadcast receiver is located will be specified. The user, therefore, can quickly assign the channel number to each channel switch.

Figure 4:
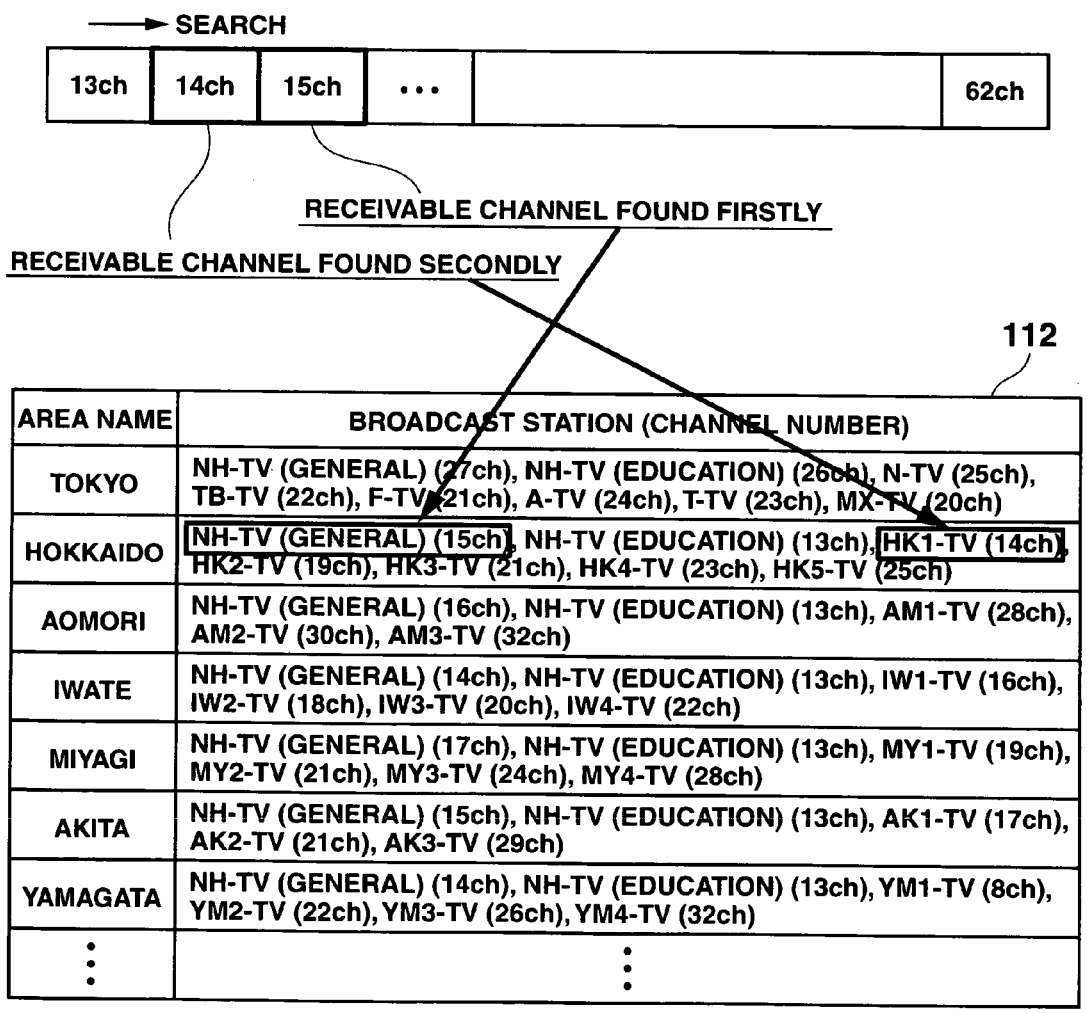
FIG. 4 is an exemplary view for explaining areas specified by referring to a receiving channel table by area when the second receivable channel is confirmed.
Figure 5:
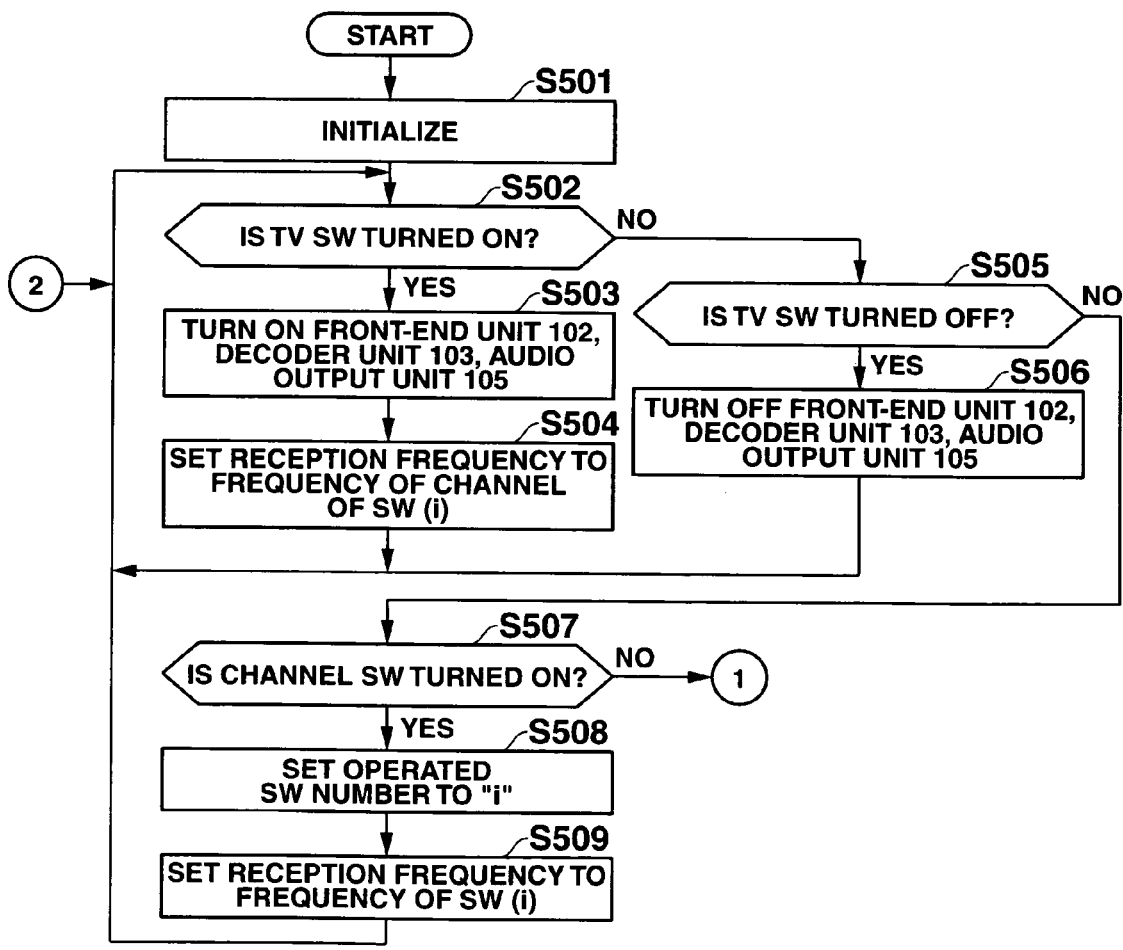
FIG. 5 is an exemplary flowchart of the first part of whole processing according to the first embodiment.
Figure 6:
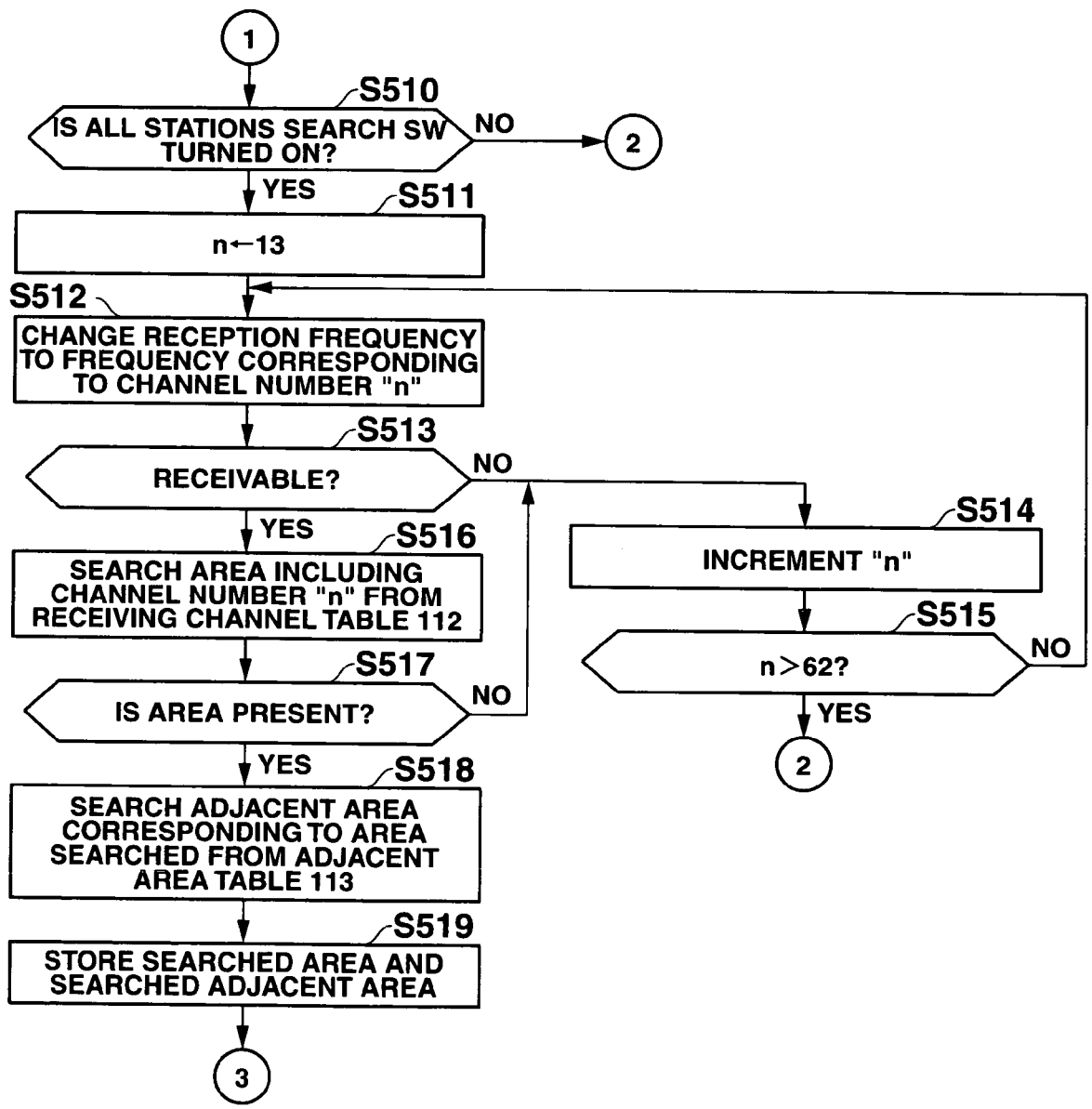
FIG. 6 is an exemplary flowchart of the part of the whole processing continuous with FIG. 5.
Figure 7:
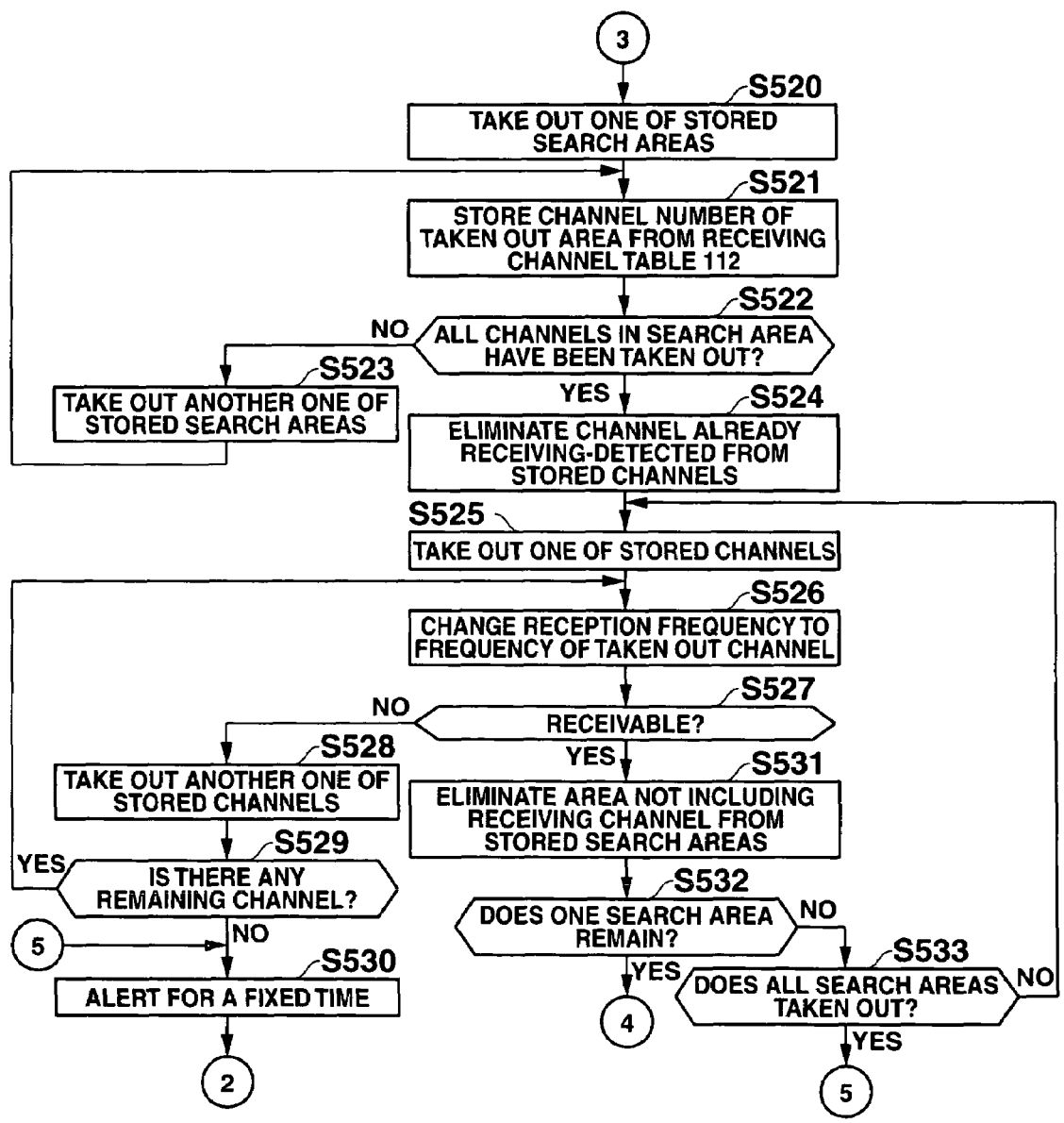
FIG. 7 is an exemplary flowchart of the part of the whole processing continuous with FIG. 6.

FIG. 4 is the exemplary view for explaining the area specified by referring to the channel table 112 when the second receivable channel is confirmed.

In the example shown in FIG. 4, channel 15 (15ch) is confirmed after 15ch is confirmed. Only the Hokkaido area can receive those two channels and the Aomori area being the adjacent area cannot receive the 15ch. Consequently, if only the area shown in FIG. 4 is targeted, the Hokkaido area is only considered as the area in which the broadcast receiver is located. Therefore, the broadcast receiver assigns the channel numbers to the channel switch by narrowing down the objects of the channel assignment to the channels receivable in the Hokkaido area.

FIG. 5 to FIG. 8 are the exemplary flowcharts of the whole processing. Operations of the broadcast receiver will be described in detail with reference to the flowcharts of the whole processing shown in FIG. 5 to FIG. 8. The whole processing is achieved as a result of executing the programs such as a main program and the management program 111 stored in the storage unit 106, by the CPU 107.

At step S501, initialization resulting from a power-on operation is performed to substitute "1" into a variable "i". At step S502, it is determined whether or not the TV switch 109b mounted on the interface unit 109 has been brought into an on-state. When the user operated the TV switch 109b to change it from the off-state to the on-state, the interface unit 109 notifies the fact to the CPU 107, so that step S502 determines "YES". At step S503, each of the front-end unit 102, the decoder unit 103 and the audio output unit 105 are activated. At step S504, a value of a component SW(i) specified by the variable "i" of an array variable SW is set to a frequency of a channel to be tuned by the front-end unit 102 and flow returns to step S502. If the determination at step S502 is "No", the flow advances to step S505.

The array variable SW is provided to manage the channel numbers assigned to each channel switch. The values substituted into each component of the array variable SW should be stored until the assignment of the channel numbers to the channel switches is newly performed, so that the memory 108 to store the values is adopted as a nonvolatile one.

It is determined at step S505 whether or not the TV switch 109b has turned into the off-state. If the user operates the TV switch 109b to change its state from the on-state to the off-state, the interface unit 109 notifies the fact, so that the determination becomes "YES". At step S506, each of the front-end unit 102, the decoder unit 103 and the audio output unit 105 is deactivated. The flow returns to step S502. If the determination is "NO", then the flow advances to step S507.

At step S507, it is determined whether the channel switch has been turned on or not. When the user operates any channel switch in channel switch group 109a, the determination at step S507 is "YES". At step S508, the switch number which the user has operated is substituted into the variable "i". At step S509, a value of a component SW(i) specified by the variable "i" of an array variable SW is set to a frequency of a channel to be tuned by the front-end unit 102 and flow returns to step S502. If the determination at step S507 is "No", the flow advances to step S510 in FIG. 6.

At step S510, it is determined whether the all station search switch 109c has turned on or not. When the user operates the search switch 109c, the determination at step S510 is "YES" and the flow advances to step S511. If the determination at step S510 is "NO", the flow returns to step S502 in FIG. 5.

After step S511, the receivable channels are confirmed and processing to newly assign the channel numbers to each channel switch is performed. Such processing is performed, as mentioned above, as the result of running the management program 111 stored in the storage unit 106, by the CPU 107.

At step S511, "13" which is the minimum number of channels enabling a broadcast signal to be transmitted is substituted into a variable "n". At step S512, the value of the variable "n" is set to the front-end unit 102 as a channel number. At step S513, a receiving level of the broadcast signal corresponding to the channel number is received from the front-end unit 102 and it is determined whether or not the broadcast signal is receivable. If the receiving level is seemed to be enough to receive the broadcast signal, the determination at step S513 is "YES" and the flow advances to step S516. If the determination at step S513 is "NO", the flow advances to step S514.

The value of the variable "n" is incremented at step S514. At step S515, it is determined whether or not the value of the variable "n" is larger than "62". If the value is larger than "62", the determination at step S515 becomes "YES" and the flow advances to step S502 in FIG. 5. If the determination at step S515 is "NO", the flow returns to step S512.

At step S516, an area enabling a channel number of the value of the variable "n" (expressed as "channel number n" in FIG. 6) to be receivable is searched from the channel table 112. At step S517, it is determined whether or not the area taken out by the search is present. If the taken out area is not present, the determination at step S517 becomes "NO" assuming that the channel number is receivable by receiving a signal other than the broadcast signal and the flow advances to step S514. If the determination at step S517 is "YES", the flow advances to step S518.

All broadcast signals determined "YES", namely, receivable in step S513 are not necessarily receivable actually. The broadcast signal might be one which is not receivable. Therefore, the first embodiment is configured to shift step S517 to step S514 in accordance with the determination of "NO" at step S517. Step S515 shifts to step S502 in FIG. 5 on the basis of the determination of "NO", because the broadcast receiver is not in a state allowing the channel numbers to be newly assigned to each channel switch.

At step S518, the adjacent area of the area taken out in step S516 is retrieved from the adjacent area table 113. At step S519, the area and the adjacent area taken out in step S516 and step S518 are stored. After storing, the flow advances to step S520 in FIG. 7. These areas can be stored by using, for example, the array variable. This situation can be applied to the after-mentioned channel numbers. The stored area and the adjacent area are generally referred to as "search area".

At step 520, one of the stored search areas is taken out. At step S521, the channel numbers which have been determined to be receivable in the taken out search area is read out from the channel table 112 and the read out channel numbers are stored. At step S522, it is determined whether or not the storing of all channel numbers in the stored search area has completed. When any search area to be stored is not remained, the determination at step S522 becomes "YES" and the flow advances to step S524. If the determination at step S522 is "NO", the flow advances to step S523 to extract another search area and then returns to step S521.

At the time when the flow advances to step S524, all channel numbers receivable in the areas having the receivable channel numbers and the area adjacent thereto are stored. In steps S524 to S533, processing to specify the area where the broadcast receiver is located by confirming (receiving detection) receivable channels and narrowing down the search area resulting from the confirmation while setting the stored channel numbers sequentially to the front-end unit 102.

At step S524, the channels which have already been conducted the receiving detection are eliminated, namely, eliminated from the stored channel numbers. At step S525, one of the remaining stored channels is read out. The read channel number is set to the front-end unit 102 at step S526. At step S527, it is determined whether or not the broadcast signal of the channel with the read channel number is receivable. If the receiving level regarding the channel number is one seemed enough to be received, the determination at step S527 becomes "YES" and the flow advances to step S531. If the determination at step S527 is "NO", the flow advances to step S528.

At step S528, another channel number is taken out from the stored channel numbers. At step S529, it is determined whether or not there is remaining channel number in the stored channel numbers. When any channel number to be taken out next is not remained there, the determination at step S529 is "NO", the flow advances to step S530. At step S530, an alarm notifying that the area where the broadcast receiver locates cannot be narrowed down into one is displayed for a fixed time period. After this, the flow returns to step S502 in FIG. 5. If the determination at step S529 is "YES", the flow returns to step S526. The display of the alarm can be achieved in a manner that, for example, the CPU 107 generates image data for the display or reads out it from the storage unit 106 and outputting it to the display unit 104.

At the step S531, a search area which includes no receivable channel is eliminated from the stored search areas.

At step S532, it is determined whether or not the number of the remaining search areas is one. If the number is one, the determination at step S532 is "YES" and the flow advances to step S534 in FIG. 8. If no remaining search area or plural remaining search areas are present, the determination at step S532 becomes "NO" and the flow advances to step S533.

At step S533, it is determined whether or not all stored search areas are taken out from the objects. When all the stored search areas are taken out from the objects, the determination at step S533 is "YES" and the flow advances to step S530. If the determination at step S533 is "NO", the flow returns to step S525. Thereby, the narrowing down the search areas is performed continuously.

Figure 8:
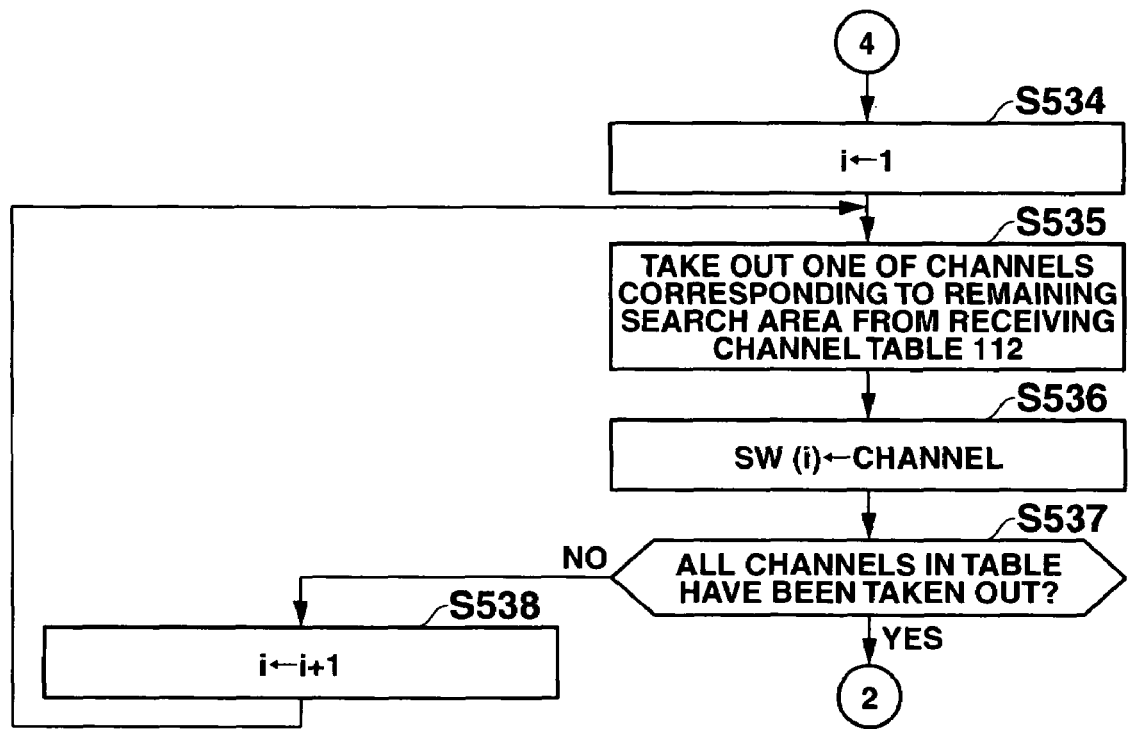
FIG. 8 is an exemplary flowchart of the part of the whole processing continuous with FIG. 7.

After step S534 in FIG. 8, processing to newly assign the channel numbers to each channel switch is conducted by substituting the channel numbers confirmed to be receivable in the area specified the presence of the broadcast receiver (search area remained as only one) into each component of the array variable SW.

At step S534, "1" is substituted into the variable "i". At step S535, one of the channel numbers receivable in the search area which is remained as only one is taken out from the channel table 112. At step S536, the taken out channel number is substituted into the component SW(i). At step S537, it is determined whether or not the substitution of all the channel numbers has completed. If the channel numbers to be substituted do not remain, the determination at step S537 is "YES" and the flow returns to step S502 in FIG. 5. If the determination at step S537 is "NO", the flow returns to step S535 after the value of the variable "i" is incremented at step S538. Thereby, the flowchart in FIG. 8 sequentially substitutes all the channel numbers to be substituted into the component of the array variable SW.

In the above description, the range of the area in which the broadcast receiver probably locates is set as the area capable of receiving the confirmed channels and as adjacent areas thereto. However, if it is clear that the receivable channels are not overlapped between adjacent areas or that such channels are few, the adjacent areas may be not included in the range of the area in which the broadcast receiver probably locates. When the adjacent areas are not included as mentioned above, the search area in which the channels which have been confirmed to be receivable are not receivable may be eliminated from the objects at step S531.

In the first embodiment, it is assumed that all channels confirmed to be receivable in the area can be received in anywhere of the area; however, the receivable channels are different depending on places even in the same area sometime. To correspond the above fact that channels cannot be received even when it has been confirmed to be receivable, when the determination at step S533 is "YES", the area in which a maximum number of the channels confirmed to be receivable is receivable or the area with the highest channel occupation ratio at the time point is specified and the channel numbers which are confirmed to be receivable in the specified area is assigned to each channel switch, respectively. The specification of such area may be performed after the completion of a whole of receiving detection if other channel numbers to be checked though the receiving detection is remained.

Although the new assignment of the channel numbers is performed through the user's instruction, the broadcast receiver may perform the assignment automatically or in accordance with an inquiry to the user when it is detected that the broadcast receiver becomes impossible to receive the broadcast signals of the assigned channel numbers. An on-vehicle broadcast receiver, for example, cannot receive the broadcast signals in a tunnel. A broadcast receiver based on the premise of the moving of its setting place may be incapable of receiving the broadcast signal temporarily even due to other reasons. Therefore, it is not necessary for the broadcast receiver to newly assign the channel numbers immediately after it is detected that the broadcast receiver becomes incapable of receiving the broadcast signals.

Second Embodiment

The broadcast receiver sometimes changes its setting place while maintaining the state capable of receiving the broadcast signals. In such a case, for example, the user views a program while riding on transportation such as a vehicle and a train.

In this case, two cases are considerable as a main reason that the broadcast receiver becomes incapable of receiving the broadcast signal along with the moving of the place, wherein the broadcast receiver has moved to such places as in a tunnel, underground and mountain area incapable of receiving the broadcast signal and moved to any adjacent area from the area where the broadcast receiver was present. In the former case, the broadcast receiver cannot newly assign the channel numbers (update channel setting). The update of the channel setting should not be performed by considering such conditions. Accordingly, the second embodiment quickly updates the channel setting in response to the latter case, namely, to the movement of the setting place from the area where it was to any adjacent areas. The movement is not required to be carried out while the broadcast signal is kept in the state capable of being received.

Figure 9:
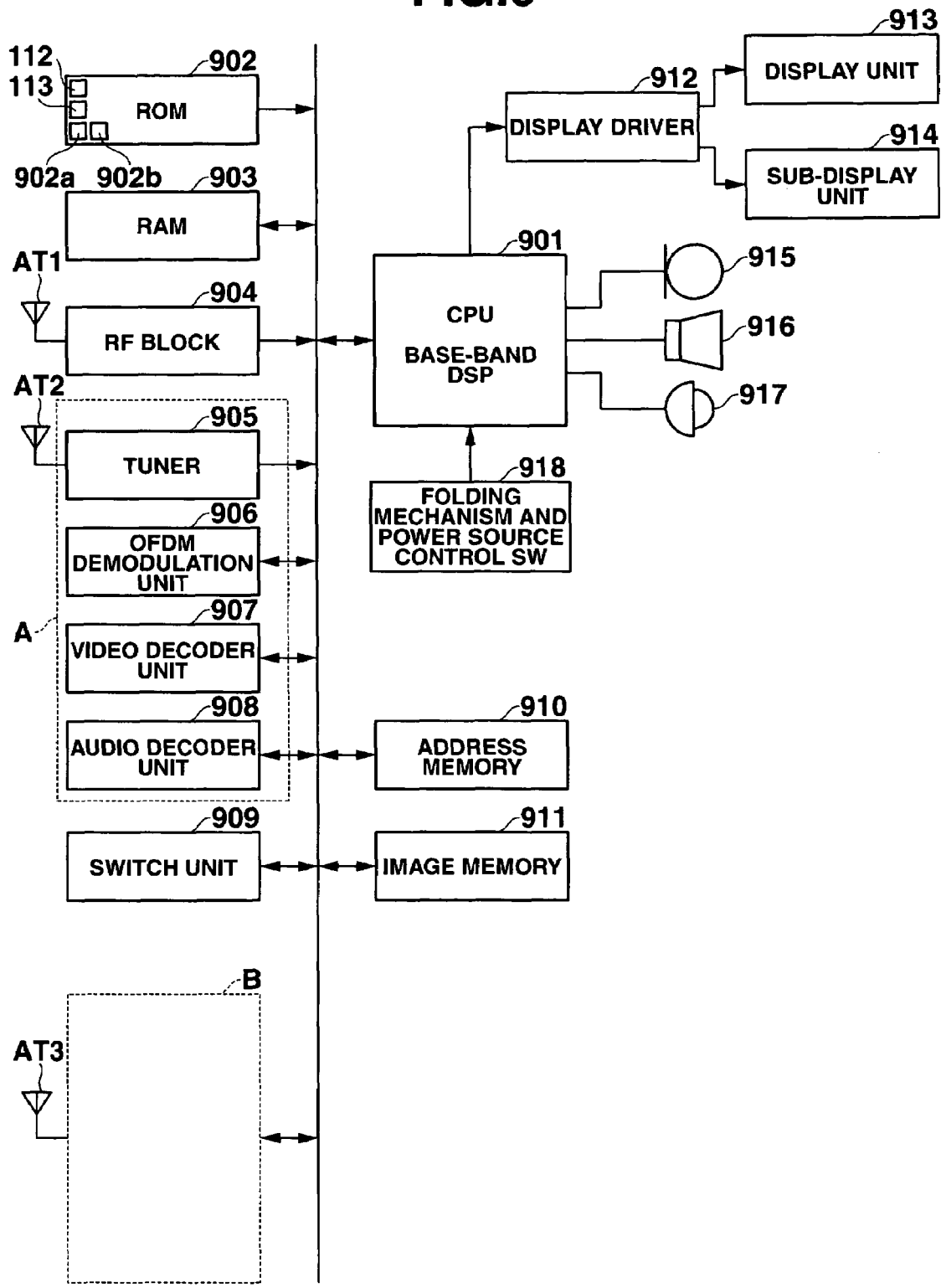
FIG. 9 is an exemplary view for explaining a configuration of a cellular phone with a broadcast receiver according to the second embodiment of the present invention mounted thereon.
Figure 11:
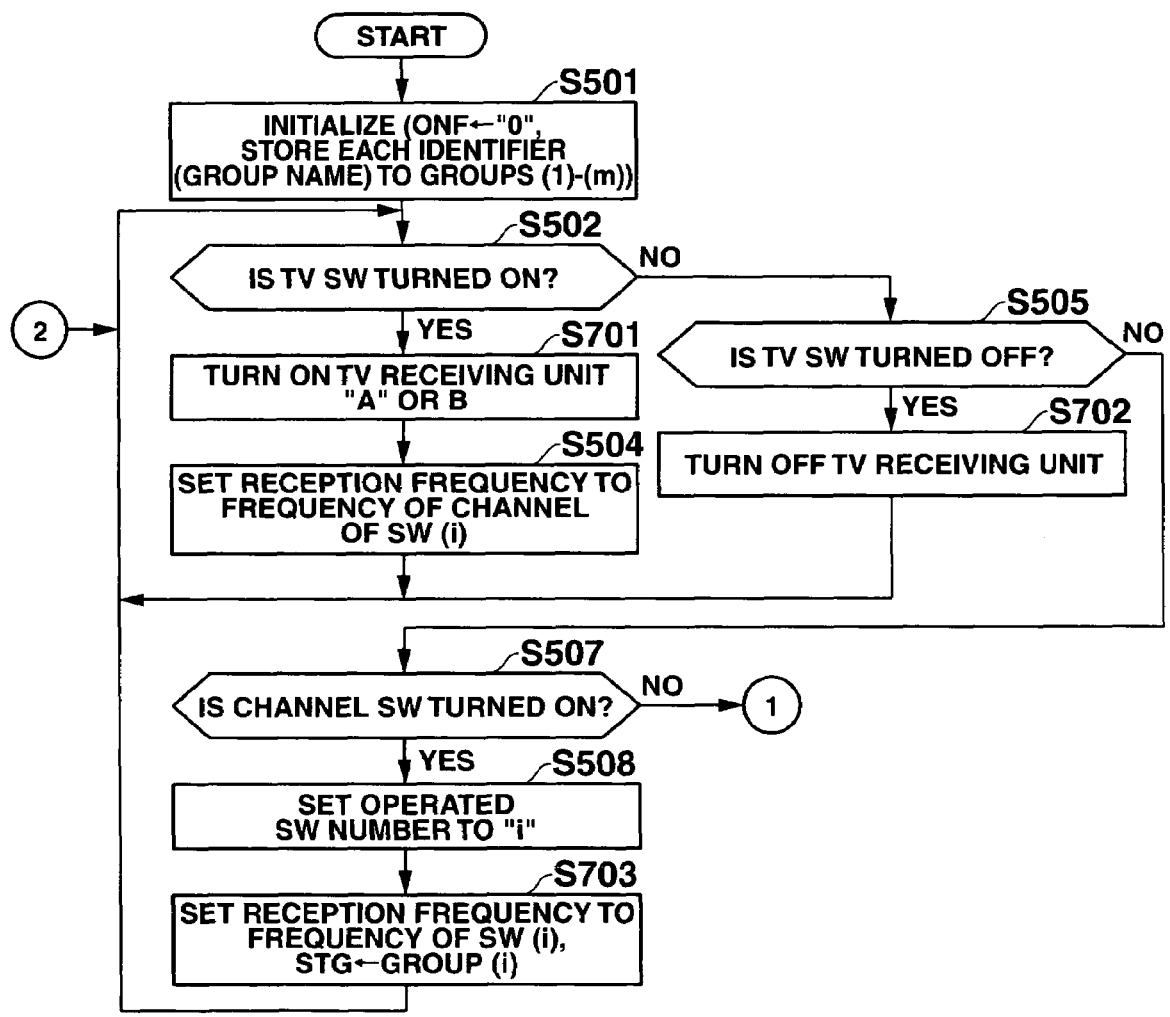
FIG. 11 is an exemplary flowchart of the initial part of the whole processing according to the second embodiment.

FIG. 9 is the exemplary view for explaining the configuration of the cellular phone with the broadcast receiver mounted thereon according to the second embodiment. The configuration of the cellular phone will be described in detail by referring to FIG. 9.

The cellular phone is a foldable one. In the second embodiment, the present invention is adopted to the broadcast receiver mounted on the cellular phone. As shown in FIG. 9, a CPU 901, a ROM 902, a RAM 903, a radio frequency (RF) block unit 904 and TV receiver units A and B are connected to a system bus.

The CPU 901 includes a digital signal processor (DSP) for base-band signal processing. The ROM 902 stores a program to be run by the CPU 901 and a variety of control data. For the control data, the ROM 902 stores a broadcast station group table 902*a* other than the channel table 112 and the adjacent area table 113. The group table 902*a* shows channels transmitting broadcast signals of the broadcast stations belonging to each group, for each group as shown in FIG. 10. FIG. 10 expresses names of broadcast stations of key stations as each group name. The program includes a receiving channel management program (hereinafter, abbreviated as management program) 902*b* being a sub-program to automatically assign the channel numbers to the channel switch. The CPU 901 reads out the management program 902*b* from the ROM 902, stores it to the RAM 903 to execute it, and performs the channel setting.

The CPU 901 is connected to a display driver unit 912. The driver unit 912 is connected to a display unit 913 and a sub-display unit 914. The CPU 901 instructs each of the display units 913 and 914 to display information (image) to be displayed through the driver unit 912.

The cellular phone is configured to make it openable/closable for a main body with the CPU 901 and a switch unit 909 housed therein and a lid unit having the display units 913 and 914, by a hinge or the like. The CPU 901 is connected to a microphone 915, a loudspeaker 916, an earphone 917, and a foldable mechanism/power control switch for opening/closing state detection (hereinafter, abbreviated as power control switch) 918 through a driver unit (not shown). The microphone 915 and the earphone 917 are mounted on the main body and the loudspeaker 916 is mounted on the lid unit. The power control switch 918 is turned on in an opening state and turned off in a closing state. The CPU 901 displays the information onto the display unit 913 only when the power control switch 918 is turned on. The CPU 901 uses an image memory 911 to display the information onto the display unit 913 and the sub-display unit 914.

The RF block 904 communicates with a cellular phone network via an antenna AT1. Therefore, the RF block 904 includes a radio transmitting/receiving unit, a radio signal processor, an audio signal processor, etc. (all of them are not shown).

In a communication state, the CPU 901 processes the audio signal input through the microphone 915 and output it to the RF block 904 to transmit the audio signal. The CPU 901 outputs the audio signal received by the RF block 904 to the loudspeaker 916 or the earphone 917 to produce a sound. Thereby, a communication with a communication partner becomes possible. When being notified an incoming signal from the RF block 904, the CPU 901 displays the information to notify the incoming signal onto the sub-display unit 914 to produce an incoming sound through the loudspeaker 916 if necessary.

The TV receiving unit "A" extracts to demodulate the broadcast signal of the set channel from the broadcast signals received via an antenna AT2, decodes a digital signal (encoded data) acquired by the decoding and outputs an image signal and an audio signal. Therefore, the TV receiving unit "A" includes a tuner 905 which extracts the broadcast signals of the set channels, an orthogonal frequency division multiplexing (OFDM) decoder unit 906 which decodes the broadcast signal output from the tuner 905, a video decoder unit 907 which decodes the digital signal of the video output from the decoder unit 906 and outputs a decoded video, and an audio decoder unit 908 which decodes the digital signal of the audio output from the decoder unit 906 and outputs a decoded audio. A TV receiving unit B is configured in the same manner. The TV receiving unit B is connected to an antenna AT 3.

The CPU 901 receives the video signal decoded by the video decoder unit 907 and develops it in, for example, the image memory 911 as a bit map image. The CPU 901 transmits the bit map image data to the display deriver unit 912 to display the image onto the display unit 913. The CPU 901 outputs the audio signal decoded by the audio decoder unit 908 to the loudspeaker 916 or the earphone 917. Thereby, broadcast programs can be viewed by the user.

The switch unit 909 includes a large number of switches and a detection circuit to detect the operations conducted thereto. The switches include an off-hook switch, an on-hook switch, a cursor switch, a clear switch, a mail switch, and a numeral switch of, for example, 0 to 9, etc. Most of the switches are configured to change function assignments thereto in response to situations. In the second embodiment, each function of the channel switch group 109*a*, TV switch 109*b*, and all station search switch 109*c* in the first embodiment is wholly assigned in response to the situations. Here, in order to avoid confusion, the second embodiment will be described on the assumption of the situation in which all of the switch group 109*a*, switch 109*b*, and switch 109*c* are included in the switch unit 909. If the number of the channels is larger than that of the channel switches, although it is usual for some channel numbers to specify channels by operating one or more types of the channel switches one or more times. However, in order to avoid confusion likewise the first embodiment, it is assumed that each one channel (channel number) is assigned for each channel switch, respectively.

An address memory 910 is a nonvolatile memory, for example, a flash memory provided so as to always store data, such as an address book to be stored. Channels (channel numbers) assigned to each channel switch, namely, values of each component of the array variable SW are stored in the address memory 910. Thereby, the channel setting (assignment of channels to each channel) last performed becomes effective until the channel setting will be updated.

In the first embodiment, if the broadcast receiver moves to a place where it cannot receive the broadcast signal, the all station search is performed again when the user operates the all station search switch 109*c*. The broadcast receiver stores the area taken out by referring to the channel table 112 and the adjacent area taken out by referring to the adjacent area table 113 as respective search areas to specify the area with the broadcast receiver located therein as the search areas. Contrary, in the second embodiment, the search areas stored in that way are focused, only the focused search areas are narrowed down preferentially and the area with the cellular phone (the broadcast receiver) located therein can be automatically specified. The automatic specification is automatically started, when it is detected that the broadcast signal which had been receivable became not receivable, namely, the broadcast signal which has been receivable became not receivable or the broadcast signal which had been expected to be received could not be received.

An ordinary user seldom moves for a long distance at once. Therefore, the user further seldom moves for the long distance in a short while. According to the above-mentioned facts, we can safely say that the ordinary user moves for relatively short distance. In other words, a number of users usually are considered to move in a certain area and its adjacent area. Even when moving for a long distance, the user make shifts to adjacent areas sequentially.

As mentioned above, the movement of the user to the area adjacent to the area to which a channel is set therein causes the case where the broadcast signal of the set channel becomes not receivable to occur extremely frequently. It is frequently regarded that the adjacent area is one of the stored search area. Therefore, even if the area to which the user moves is limited to the stored search area, it becomes possible to specify with a higher probability the area in which the cellular phone locates. Since the search area is a part of a whole, channels to be objects to confirm whether the broadcast signals are receivable or not are extremely reduced in number. Accordingly, the broadcast receiver can quickly specify the area with the cellular phone located therein with a high probability.

Operations of the cellular phone shown in FIG. 9 as a broadcast receiver will be described in detail with reference to the flowcharts of each processing shown in FIG. 11 to FIG. 19.

FIG. 11 to FIG. 17 show the flowcharts of the whole processing. The whole processing show a flow thereof by abstracting processing executed so as to realize operations as the broadcast receiver. The CPU 901 realizes the whole processing by running the main program and the management program 902*b* stored in the ROM 902.

In FIGS. 5 to 8 and FIGS. 11 to 17, the same or the basically same contents of processing executed by the CPU 901 with one another are denoted with the same reference symbols.

Thereby, parts different from those of the first embodiment will be focused to be described.

In the second embodiment, the broadcast receiver is initialized to substitute "1" into the variable "i" and "0" to a variable ONF and to store the group names (identifiers) in the groups (1)-(m) being elements of the array variable, respectively (step S501). The array variable is prepared so as to determine the groups to which the broadcast stations transmitting the broadcast signals of the channels assigned to each channel switch are belonged. The variable ONF is prepared so as to determine whether the channels possible to receive the broadcast signals are confirmed or not when the channel setting is updated. The "0" substituted into the variable ONF is a value to indicate that a channel has not been confirmed yet. If the channel has been confirmed, "1" is substituted, as the value into the variable ONF.

The storing of the group names (identifiers) corresponding to groups (1)-(m) is conducted only when the group names are not stored and also the channel numbers are substituted into components SW(1)-SW(m), respectively. The substitutions of the respective channel numbers onto the components SW(1)-SW(m), respectively, mean that the areas were specified in past times. Thereby, the broadcast stations to transmit the broadcast signals through the channels of the channel numbers substituted into the components SW(1)-SW(m), respectively, can be specified by referring to the channel table 112 (FIG. 2). The group with the broadcast stations belonged thereto can be specified by referring to the broadcast station group table 902a (FIG. 10). The names of the group specified by the way as mentioned above are stored in the groups (1)-(m), respectively.

At step S502, it is determined whether an operation ("ON" operation) to function the cellular phone as a broadcast receiver is performed or not to the TV switch 109b of the switch unit 905. When the user operates the TV switch 109b, since the fact is notified from the switch unit 909 to the CPU 901, the determination at step S502 is "YES" and the flow advances to step S701. At step S701, the TV receiving unit "A" (or TV receiving unit B) is activated to start an output of video or audio by the TV receiving unit "A" (or TV receiving unit B). Step S504 follows step S701. If the determination at step S502 is "NO", the flow advances to step S505.

At step S505, it is determined whether or not an operation ("OFF" operation) to stop the function of the cellular phone as the broadcast receiver is conducted to the TV switch 109b of the switch unit 905. If the user performs the operation for the off-operation to the TV switch 109b, the determination at step S505 is "YES", the flow returns to step S502 after step S702 to stop the active TV receiving unit "A" (or TV receiving unit B). If the determination at step S505 is "NO", the flow advances to step S507.

In the second embodiment, after substituting the number of the channel switch operated by the user into the variable "i" (step S508), the flow advances to step S703. At step S703, the value of the component SW(i) is set as a channel to be tuned by the tuner 905 of the active TV receiving unit "A" (or the TV receiver unit B) in operation and the value of the group (i) is substituted into variable STG. After this, the flow returns to step S502. The substitution of value of the group (i) into the variable STG at STEP 703 causes the group name to which the broadcast station for transmitting the broadcast signal of the channel tuned finally by the user to be held in the variable STG. The substitution of the value of the group (i) into the variable STG is conducted even at step S504.

Figure 12:
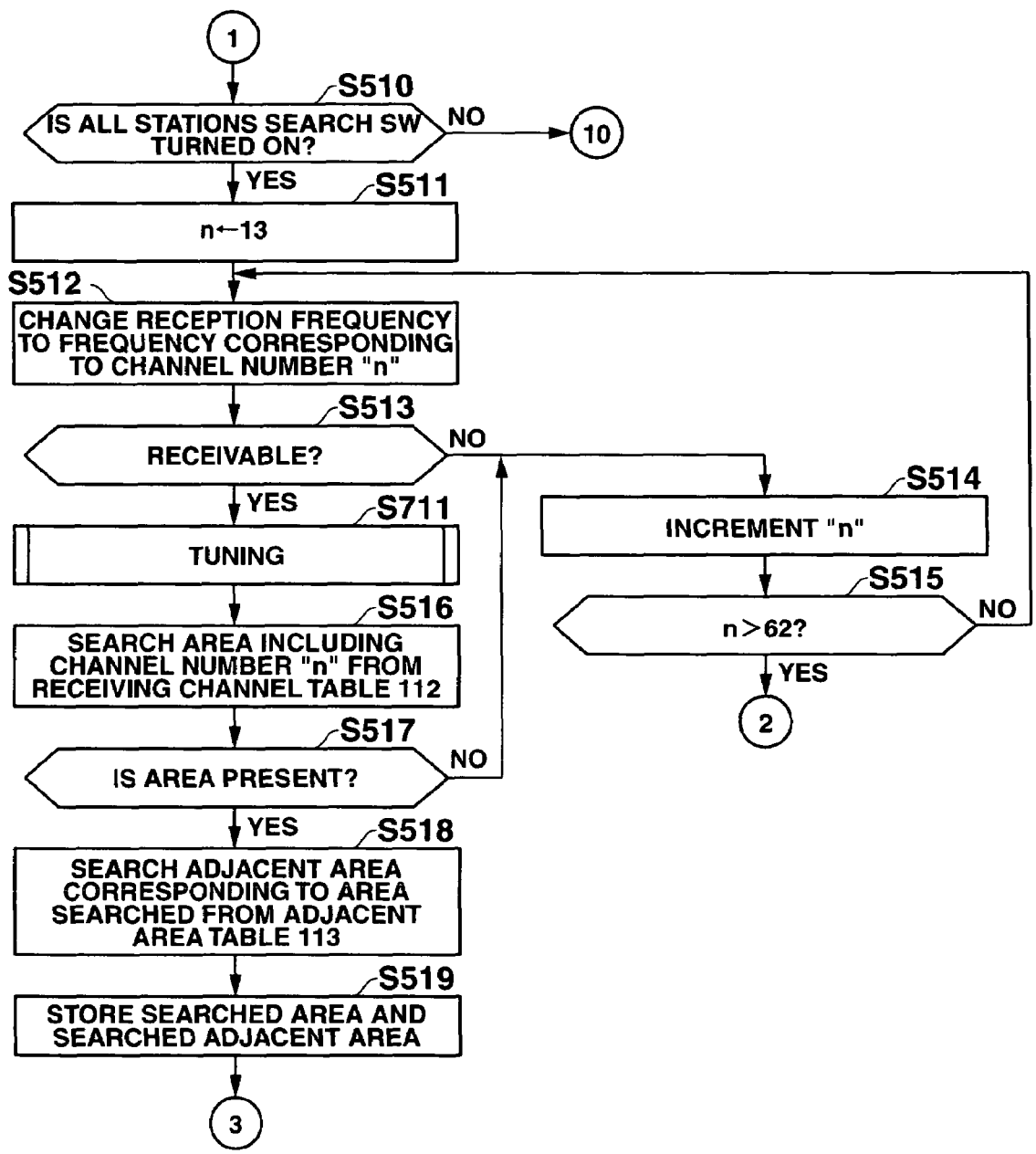
FIG. 12 is an exemplary flowchart of the part of the whole processing continuous with FIG. 11.

At step 510 in FIG. 12, it is determined whether or not the all station search switch 109c is turned on. When the user operates the search switch 109c, the determination at step S510 is "YES" and the flow advances to step S511. If the determination at step S510 is "NO", the flow advances to step S731 in FIG. 14.

In the second embodiment, if the determination at step S513 is "YES", tuning processing so as to view a receivable channel tentatively is performed at step S711. After step S711, the flow advances to step S516.

Figure 18:
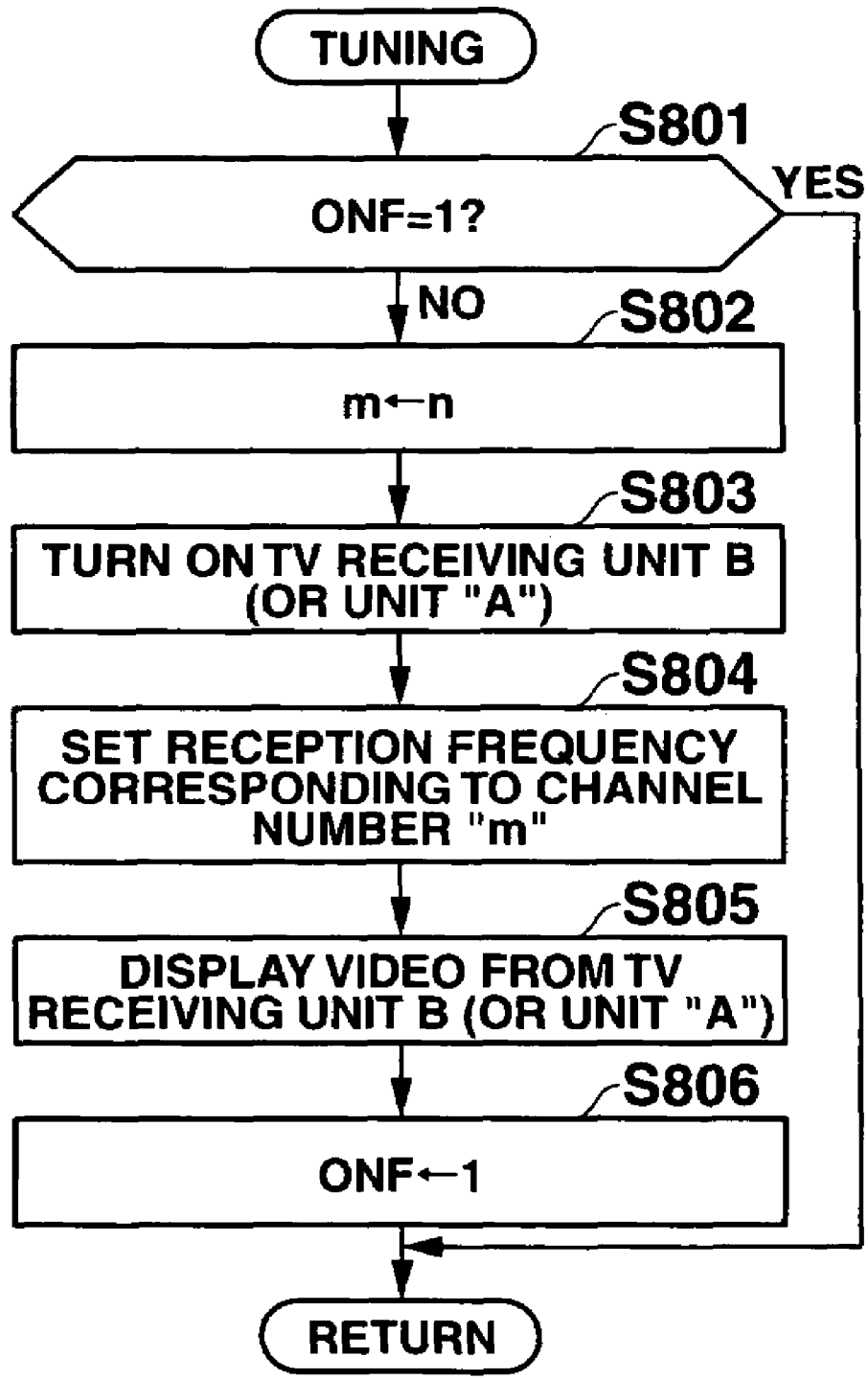
FIG. 18 is an exemplary flowchart of tuning processing.

FIG. 18 is the exemplary flowchart of the tuning processing (step S711). Hereinafter, the tuning processing will be mentioned in detail by referring to FIG. 18.

In the second embodiment, as shown in FIG. 9, the cellular phone has two TV receiving units "A" and B. During update of the channel setting, one of them is used for a confirmation of a receivable channel (channel search) and the other is simultaneously used for program view for the same time period. Thereby, the cellular phone suppresses outputs of the channel videos sequentially switched by a channel search at a minimum to continuously view a viewable channel even in searching. The tuning processing is performed on order to achieve the continuous viewing.

At step 801, it is determined whether or not the value of the variable ONF is "1". When the value of the variable ONF is "1" (the determination is "YES"), a series of processing is skipped to terminate the tuning processing. If the determination at step S801 is "NO", the flow advances to step S802.

At step S802, a value of a variable "n" (channel number confirmed to be receivable immediately before) is substituted into a variable "m". At step S803, the TV receiving unit B (or TV receiving unit "A") is initiated. At step S804, the value of the variable "m" is set as a channel number to be tuned by the tuner 905 of the initiated TV receiving unit B (or TV receiving unit "A"). At step 805, a display, of a video signal output from the video decoder unit 907 of the initiated TV receiving unit B (or TV receiving unit "A") onto the display unit 913, is started and a production, of a sound through the loudspeaker 915 or the earphone 917 by using the audio signal output from the audio decoder unit 908, is started. Whereby, a receivable channel is brought into a viewable state. After this, at step S806, "1" is substituted into the variable ONF to terminate a series of processing.

In step 711, the tuning processing described above is performed. Thereby, the viewing of the channel which was firstly confirmed to be receivable is made possible by the TV receiving unit B (or TV receiving unit "A").

Figure 13:
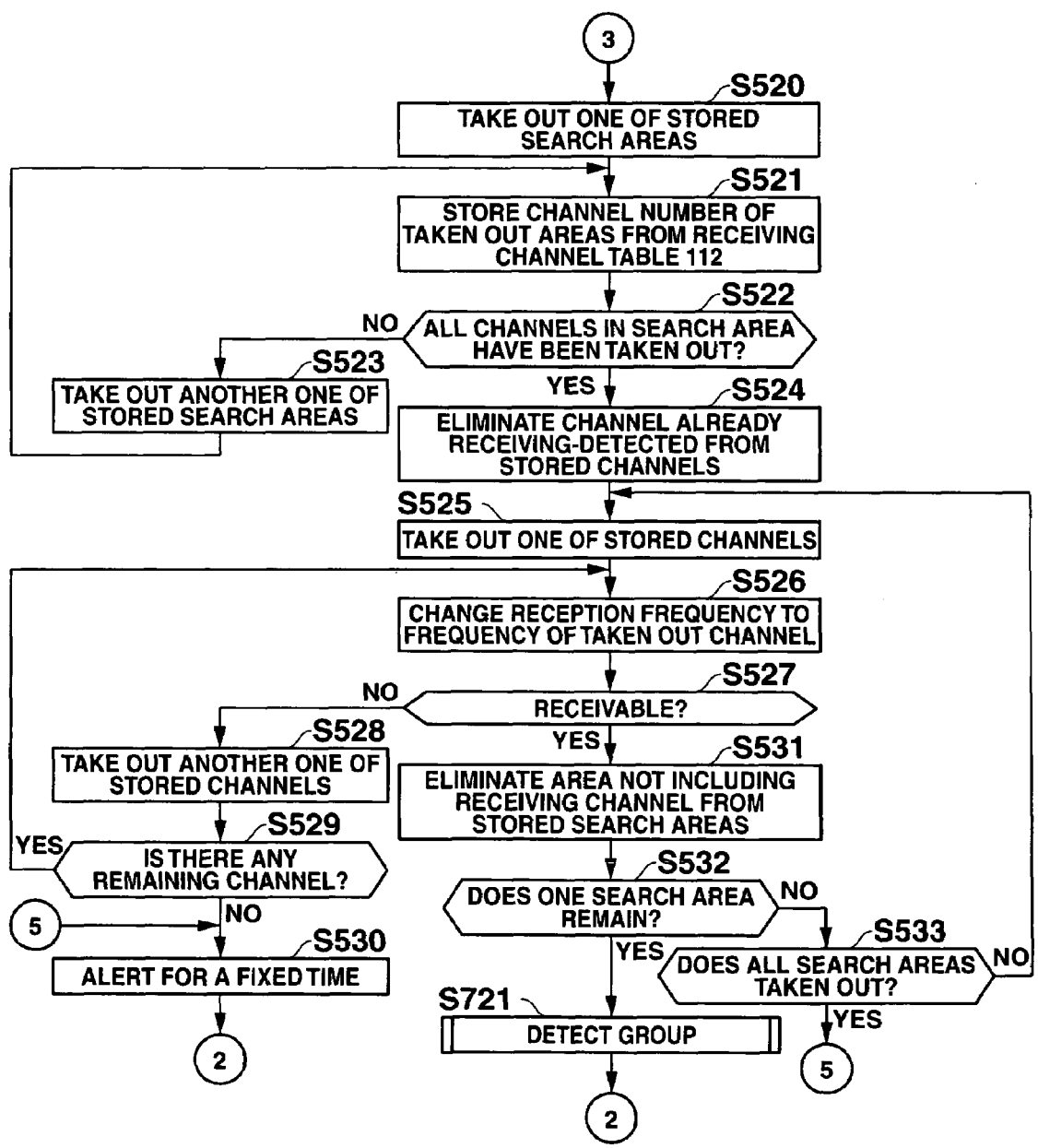
FIG. 13 is an exemplary flowchart of the part of the whole processing continuous with FIG. 12.

In the second embodiment, when the determination at step S532 in FIG. 13 is "YES", the flow advances to step S721 to perform group detection processing. After this performance, the flow returns to step S502 in FIG. 11.

The determination "YES" at step S532 means that the area in which the cellular phone is located is specified. Therefore, as described below, the group detection processing substitutes the channel number receivable in the specified area into the component SW(k) (k is integer 1 or more), and substitutes the group name to which the broadcast station to transmit the broadcast signal in its channel is belonged thereto into the group (k).

Figure 14:
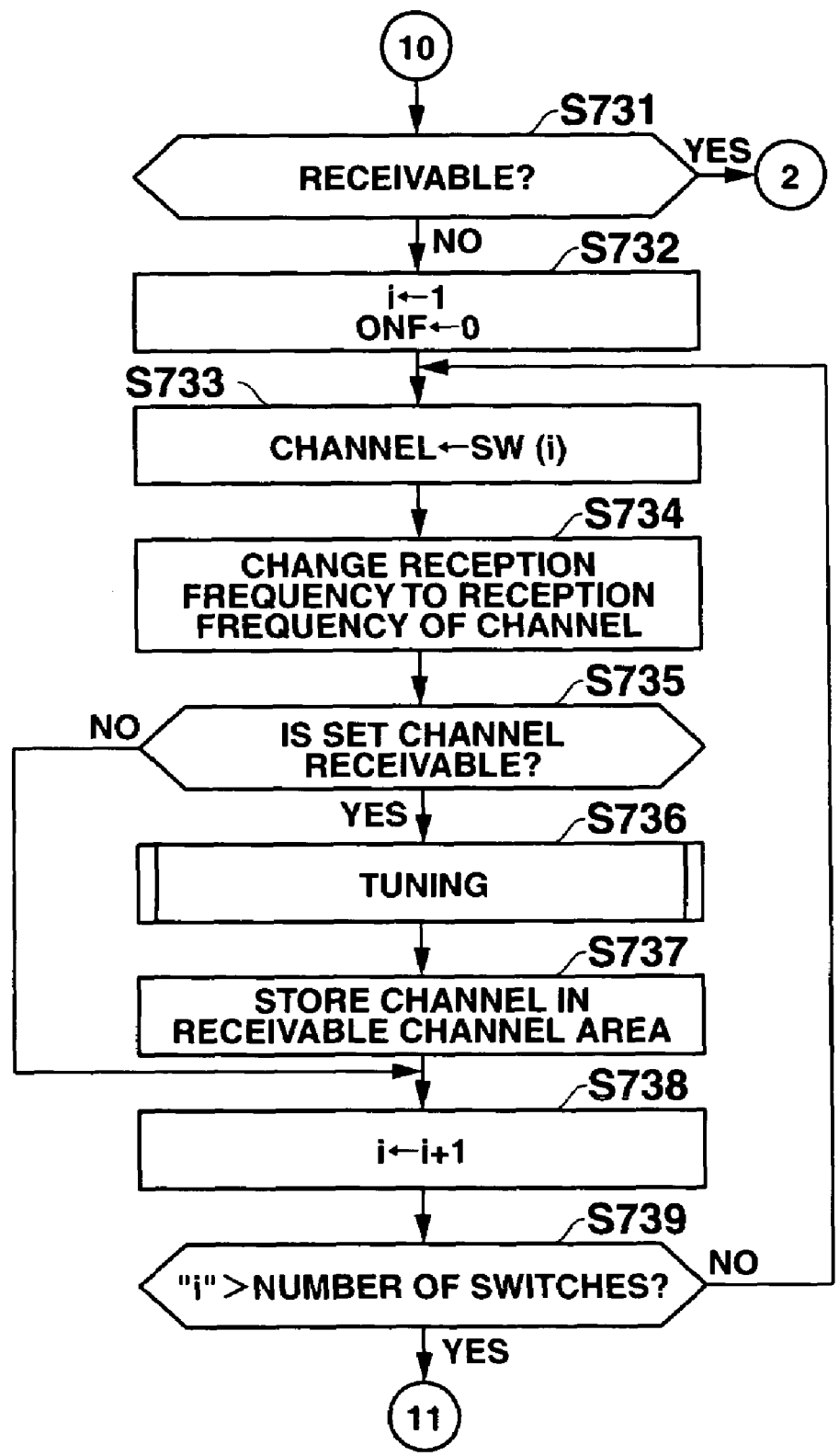
FIG. 14 is an exemplary flowchart of the part of the whole processing continuous with FIG. 13.
Figure 15:
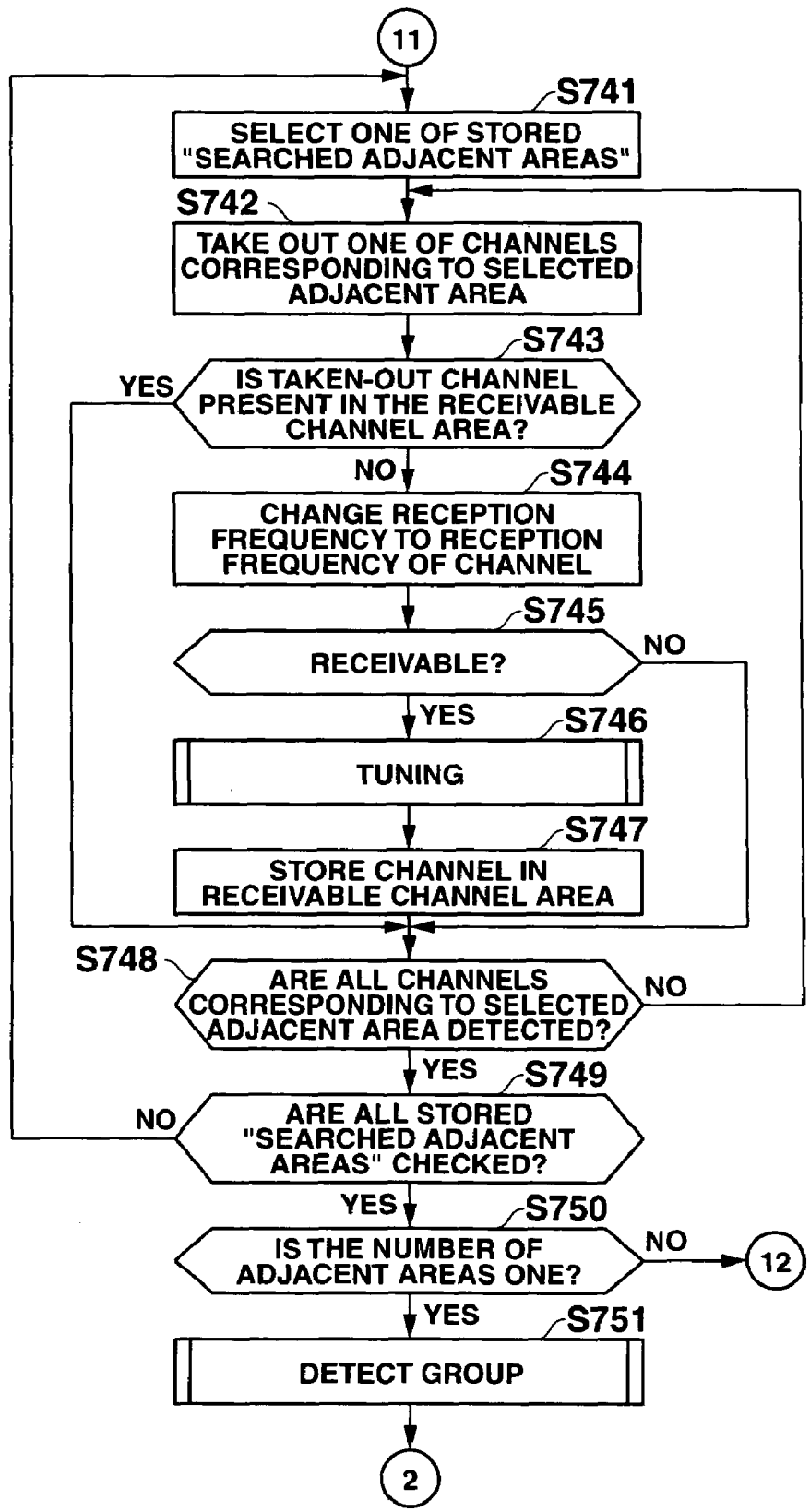
FIG. 15 is an exemplary flowchart of the part of the whole processing continuous with FIG. 14.

After step S510 in FIG. 12 made a determination of "NO", the flow advances to step S731 in FIG. 14 to determine whether the broadcast signal of the channel which was set into the tuner 905 can be received or not. If the receiving level of the broadcast signal tuned by the tuner 905 is not enough for receiving, the determination at step S731 is "NO" and the flow advances to step S732. If the receiving level is enough, the determination results in "YES" and the flow returns to step S502 in FIG. 11.

After step S732, it is assumed that the receivable channel has been changed depending on the movement of the places, and processing to automatically update the channel setting will be performed.

At step S732, "1" and "0" are substituted into the variables "i" and ONF, respectively. At step 733, the channel number substituted into the component SW(i) is decided as a channel number to be set next to set it in the tuner 905. Thereby, a reception frequency to extract the broadcast signal is changed (step S734) then the flow advances to step S735.

At step S735, it is determined whether the set channel is receivable or not. If the receiving level of the broadcast signal of the set channel is enough for receiving, the determination is made as "YES" and the flow advances to step S736. At step S736, tuning processing (refer to FIG. 18) is performed. At step S737, a channel number, confirmed to be receivable, is stored in a receivable channel area, for example, being provided in the RAM 903. Furthermore, after incrementing the value of the variable "i" at step S738, the flow advances to step S739. If the receiving level is not enough for receiving; the determination at step S735 is "NO" and the flow advances to step S738.

At step S739, it is determined whether or not the value of the variable "i" is larger than a total number of the channel switches with the channel numbers assigned thereto. If the value of the variable "i" is larger than the foregoing total number, the flow advances to step S741. Otherwise stated, the determination is given as "NO", the flow returns to step S733. Thereby, the process intends to confirm at first whether the channels having the numbers assigned to each channel switch are receivable or not.

At step S741, one of search areas which have not been selected from the search areas stored in step S519 or step S770 is selected. At a next step S742, one of channel numbers which are receivable in the selected search area with reference to the channel table 112 is taken out. At step S743, it is determined whether or not the taken-out channel is present in the receivable channel area. If the channel number is not stored in the channel area, the determination results in "NO" and the flow advances to step S744. If the channel number is stored in the channel area, the determination results in "YES" and the flow advances to step S748.

At step S744, the taken channel number is set into the tuner 905 to change the frequency to receive the broadcast signal. At the next step S745, it is determined whether or not the set channel is receivable. If the receiving level of the broadcast signal of the set channel is enough for receiving, the determination at step S745 is "YES" and the flow advances to step S746. At step S746, tuning processing (refer to FIG. 18) is executed. After the channel number confirmed to be receivable is stored in the receivable channel area (step S747), the flow advances to step S748. On the contrast, if the termination at step S745 is "NO", the flow advances to step S748.

At step S748, it is determined whether or not the above-mentioned processing has already checked all channels which were conformed to be receivable in the search area selected in step S741. If there is no channel to be checked, the flow advances to step S749. Otherwise, the determination at step S748 is "NO" and the flow returns to step S742. Thereby, another unchecked channel to be checked is taken out at step S742.

In step S749, it is determined whether or not all the stored search areas are checked. If there is no unchecked search area, the determination becomes "YES" and the flow advances to step S750. In a contrast case, the determination becomes "NO" and the flow returns to step S741. Whereby, the processing selects another unchecked search area to confirm whether the channel recognized as the receivable one on the search area is surely receivable or not.

At step S750, it is determined whether or not the number of adjacent areas stored is only one. If only one such a search area exists, the determination becomes "YES", after performing the group detection processing (step S751) the flow returns to step S502 in FIG. 11. Otherwise, the determination becomes "NO" and the flow advances to step S761 in FIG. 16.

The determination of "NO" at step S750 means that the area with the cellular phone located therein cannot be found out from the search areas stored at the time when the channel setting is update immediately before. Therefore, at step S761 (FIG. 16) to step S796 (FIG. 17), processing in order to set the area with the cellular phone located therein to update the channel setting is performed for other areas.

Contents of the processing executed in step S761 (FIG. 16) to step S796 (FIG. 17) and a most part of its execution order are the same or basically same as those in step S511 (FIG. 12) to step S721 (FIG. 13). Therefore, steps different from each other between step S761 (FIG. 16) to step S796 (FIG. 17) and step S511 (FIG. 12) to step S721 (FIG. 13) will be focused and will be described hereinafter.

At step S761, "13" is substituted into the variable "n". After the substitution, at step S762, it is determined whether or not the value of the variable "n" is present as a channel number in the receivable channel area. If the value is not stored in the channel area, step S762 makes a determination of "NO" and the flow advances to step S763. Otherwise, step S762 makes a determination of "NO" and the flow advances to step S765. Steps S763 to S770 are the same as steps S512 to S519 in FIG. 12, so that the explanation therefore will be eliminated. When the determination is "YES" at step S766, the processing returns to step S502 in FIG. 11. After the execution of the processing at step S770, the processing advances to step S781 in FIG. 17. At step S770 and step S519 (FIG. 12), the searched area is stored in, for example, the address memory 910 to hold it. Thereby, the stored area becomes possible to be referred in the case of the next update of the channel setting.

Figure 17:
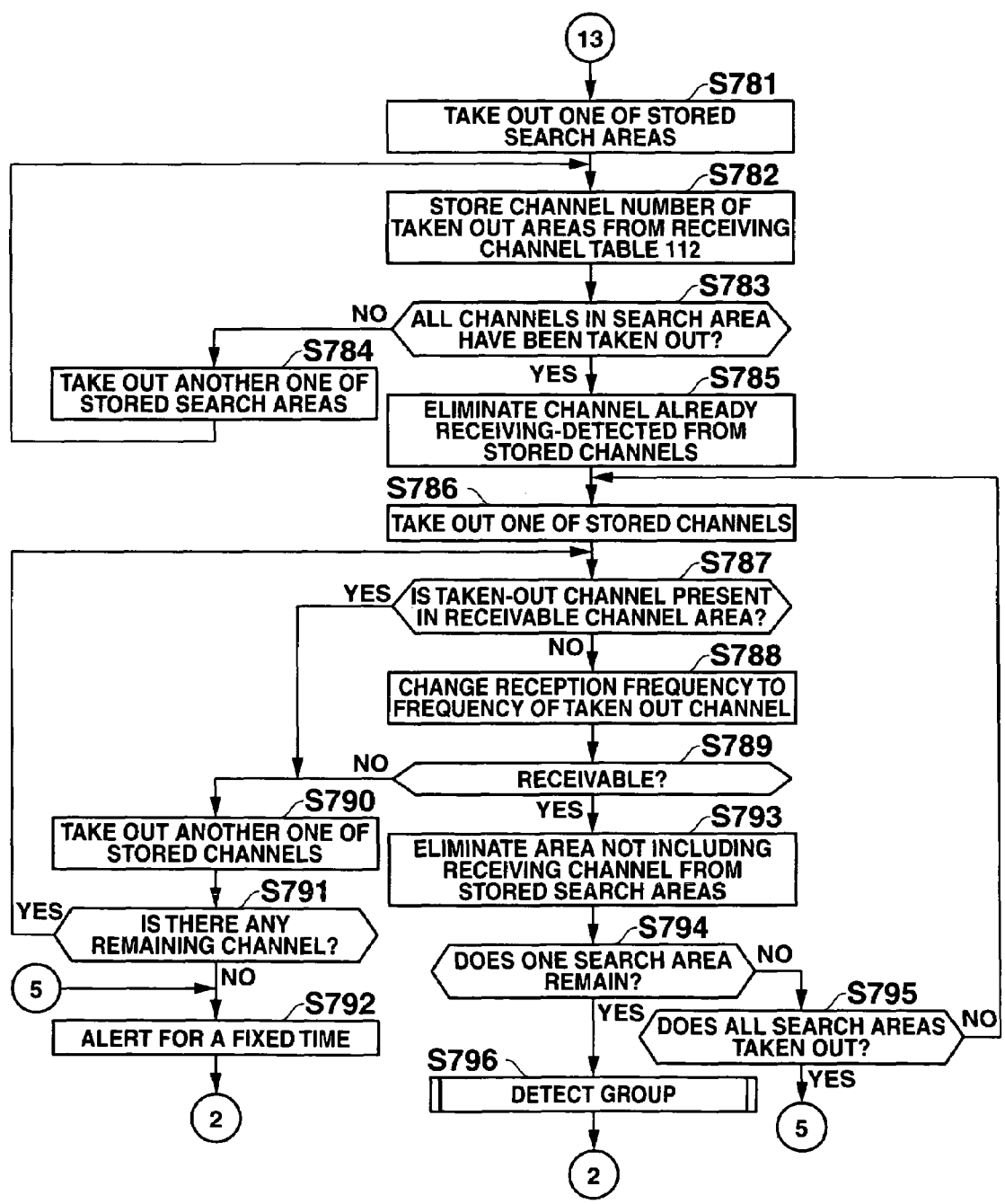
FIG. 17 is an exemplary flowchart of the part of the whole processing continuous with FIG. 16.

Steps S781 to S786 and steps S788 to S796 in FIG. 17 are basically the same as steps S520 to S525 and steps S526 to S721 in FIG. 13, respectively. At step S787 which follows step S786, it is determined whether or not the channel number taken out in step S786 is present in the receivable channel area. If the channel number is not present in the channel area, step S787 determines "NO" and the flow advances to step S788, and otherwise, the determination at step S787 becomes "YES" and the flow advances to step S790. After performing step S792 or step S796, the processing returns to step S502 in FIG. 11.

In this way, in the second embodiment, if the cellular phone could not specify the area with the cellular phone located therein among the stored search areas, it specifies the area in a manner to omit the channels which have already been confirmed to be receivable. Thereby, overlapping of checks to confirm whether the area can receive the broadcast signal or not is suppressed and the time required specifying the area is shortened.

Figure 19:
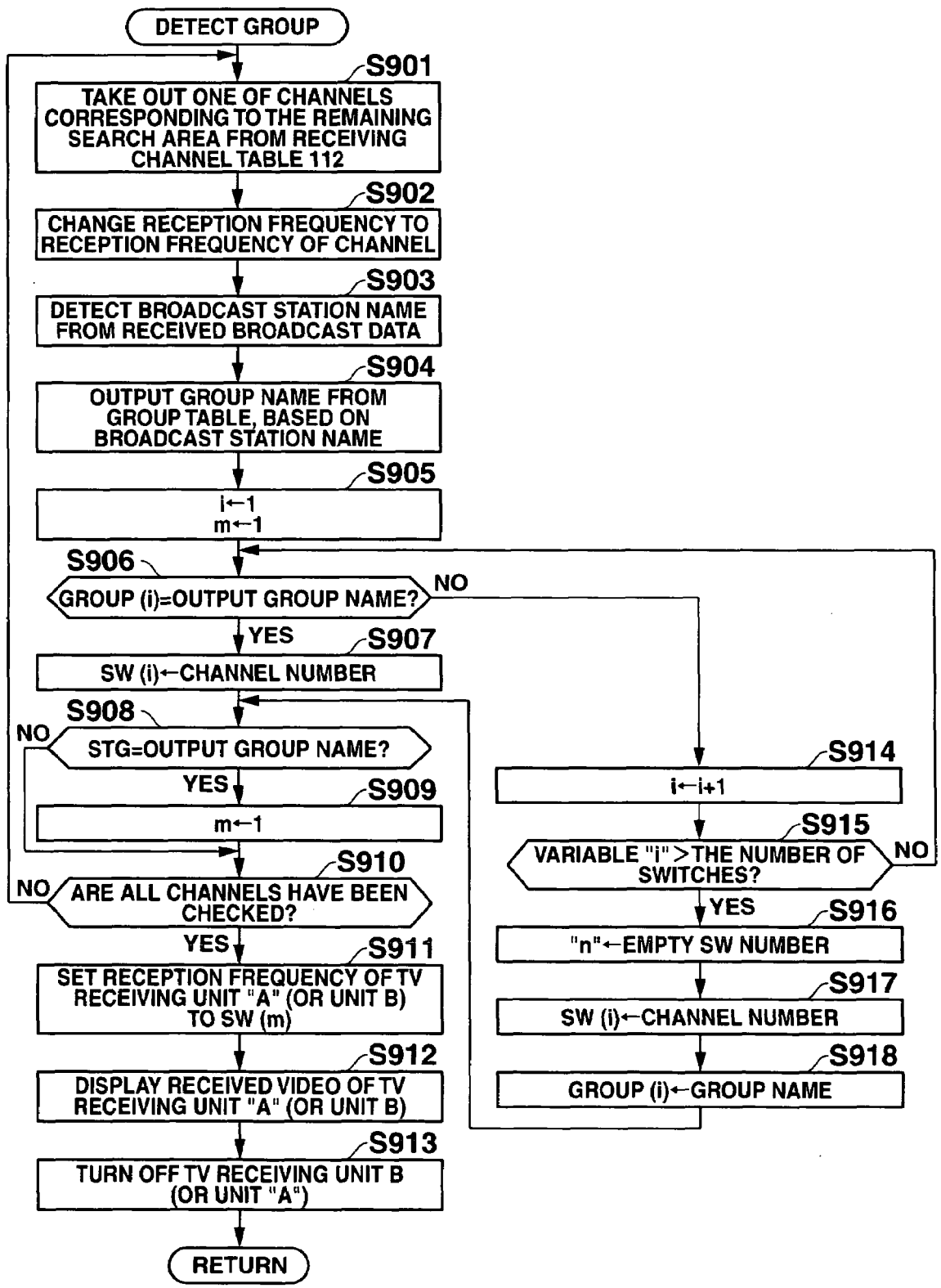
FIG. 19 is an exemplary flowchart of group detection processing.

FIG. 19 is the exemplary flowchart of a group detection processing performed at steps S721, S751 or S796. Now, the group detection processing will be described in detail by referring to FIG. 19.

Many broadcast stations are configured to transmit names of their own stations through the broadcast signals, as identifiers. The group detection processing utilizes these identifiers to specify the group with the broadcast stations transmitting the broadcast signals though the receivable channels belonged thereto. The group detection processing specifies the group by referring to the broadcast group table 902a (FIG. 10).

At step S901, one of the channel numbers which are confirmed to be receivable in the solely remained search area is taken out from the channel table 112. At step S902, the taken out channel number is set to the tuner 905 and the frequency to extract the broadcast signal is changed. At step S903, the broadcast signal received by the tuner 905 is received to detect the name of the broadcast station form the broadcast signal. After detecting, the flow advances to step S904. The tuner 905 constitutes a TV receiving unit (for example, TV receiving unit "A") to be used for confirmation whether the channel is receivable or not.

At step S904, the broadcast station group table 902a is referred to identify the group name in which the detected broadcast name locates. At step S905, "1" is substituted into variables "i" and "m". At step S906, it is determined whether or not the group name stored in the group (i) matches with the group name specified at step S904. If they do not match with each other, the determination becomes "NO" and the flow advances to step S914. Otherwise, the determination is "YES" and the flow advances to step S907.

Some of the broadcast stations transmit the names of the belonging groups as well as the name of the stations as the identifiers through the broadcast signals. When only such broadcast stations are targeted, the group detection processing may directly detect the group name at step S903 to omit the execution of the processing at step S904.

At step S907, the channel number taken out at step S901 is substituted into the component SW(i). At step S908, it is determined whether or not the group name substituted into the variable STG matches with the group name specified at step S904. In the case of matching of the group names, the determination at step S908 results in "YES", the flow advances to step S910 after substituting a value of the variable "i" into the variable "m" (step S909). Otherwise stated, the determination at step S908 results in "NO", and the flow advances to step S910. As mentioned above, the variable STG has held the name of the group with the broadcast station transmitting the broadcast signal through the channel which was finally set belonged thereto.

At step S910, it is determined whether or not the check to specify the group name for all channels confirmed to be receivable at the solely remained search area has been completed. If a channel to be checked is present, the determination becomes "NO" and the flow returns to step S901. Thereby, another channel is checked. Otherwise, the determination at step S910 is "YES" and the flow advances to step S911.

At step S911, the channel number substituted into the component SW(m) is set to the tuner 905 of the TV receiving unit "A" (or TV receiving unit B) to change the frequency for use in an extraction of the broadcast signal. At step S912, outputs of video and audio by the TV receiving unit "A" (or TV receiving unit B) are started. After this, an operation of the TV receiving unit B (or TV receiving unit "A") is stopped at step S913 to terminate a series of processing.

In a manner described above, in the second embodiment, if a broadcast station belonging to the same group as that of the broadcast station transmitting the broadcast signal through the channel of which the group is set last is present among broadcast stations to transmit broadcast signals through receivable channels, the channel by which the broadcast station belonging to the same group transmits the broadcast signal is automatically set. This is because the same group has the higher probability allowing the user to view a program desired for viewing by the user or a program further desired for viewing. Accordingly, the cellular phone can enhance a convenience for the user by automatically setting such channels.

When the determination at step S906 is given as "NO", the value of the variable "i" is incremented at step S914. At step S915, it is determined whether or not the value of the variable "i" is larger than the total number of the channel switches to which the channel numbers have been assigned. If the value of the variable "i" is larger than the total number, the determination becomes "YES" and the flow advances to step S916. Otherwise stated, the determination becomes "NO" and the flow returns to step S906.

At step S916, a number indicating a channel switch with the channel number (expressed as "empty SW number" in FIG. 19) not assigned thereto among channel switches is substituted into the variable "n". At step S917, the channel number taken out at step S901 is substituted into the component SW(n). At step S918, the group name specified at step S904 is stored in the group (n). After this, the flow returns to step S908.

Figure 16:
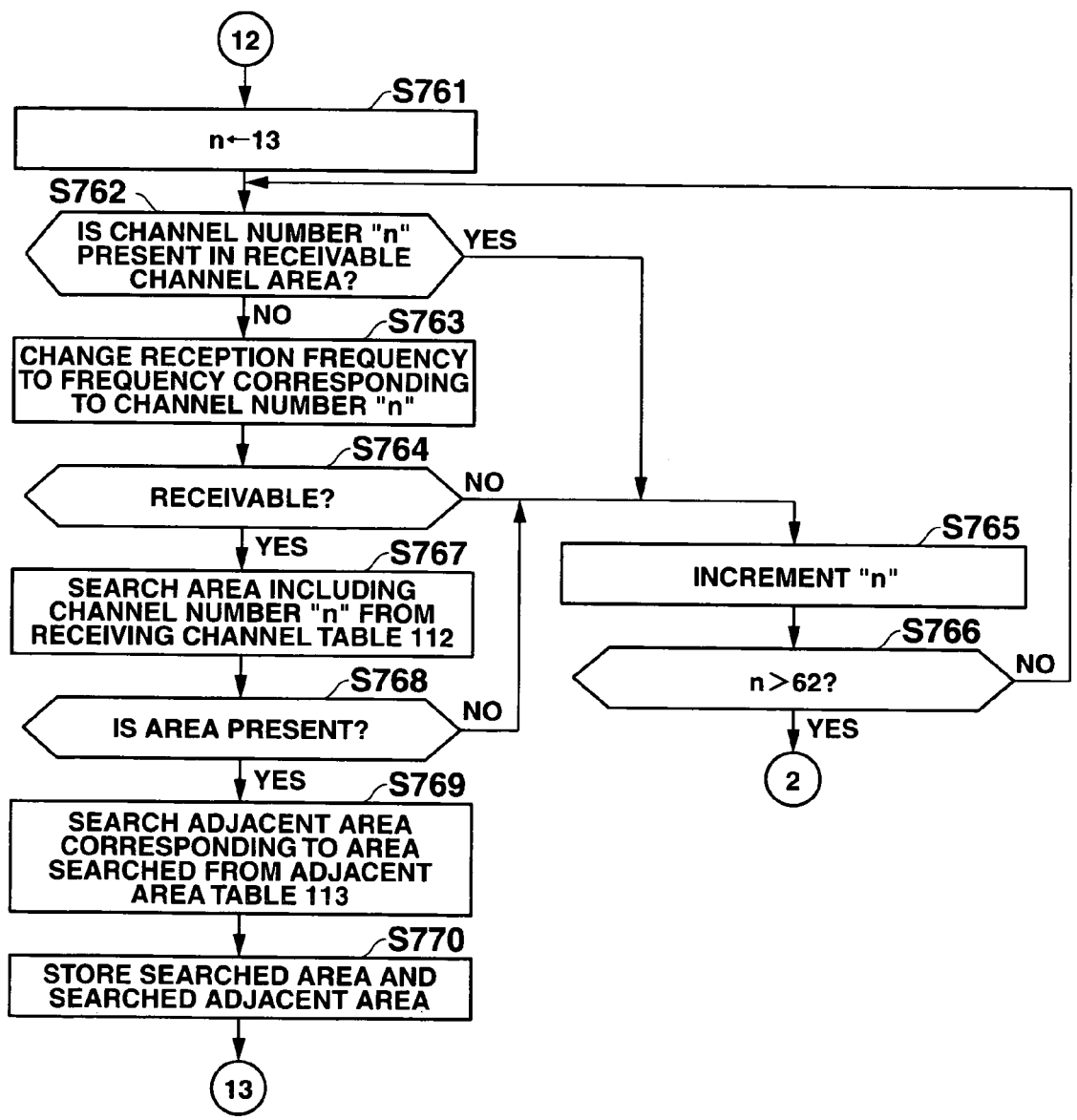
FIG. 16 is an exemplary flowchart of the part of the whole processing continuous with FIG. 15.

In the second embodiment, having configured to automatically update the channel setting when it is detected that the broadcast signal in the channel set to the tuner 905 cannot be received, the second embodiment can be configured to update the channel setting in accordance with user's instruction. At step S750, if the area in which the cellular phone locates could not been found out from the search areas stored at updating of the channel setting performed immediately before, the determination becomes "NO" and the flow advances to step S761 (FIG. 16). Instead, the flow may advance to step S511 (FIG. 12).

For specifying the area in which the cellular phone locates among the stored search area, although the broadcast receiver in the second embodiment is configured to perform receiving detection of the channels allowed to be respectively received in the search areas wholly and unconditionally, it is not necessary for the second embodiment to be configured in such a manner. In the second embodiment, the broadcast receiver can be configured to confirm whether the area conceivable as an area in which the cellular phone locates becomes one or not. In such a case, the broadcast receiver can update the channel setting further quickly. The search areas to be objects include the areas to be taken out through the search for the channel table 112 using combinations of the channel numbers assigned to each channel switch and the adjacent areas taken out through the search for the adjacent area table 113 using the areas taken out through the search for the channel table 112. These areas can be specified as needed, so that they are not needed to be stored.

The programs to realize the broadcast receivers such that described in the first and second embodiments of the present invention may be recorded on a recording medium such as a CD-ROM, a DVD and a removable flash memory to be distributed. A part or whole of the programs may also be delivered via a communication network such as the internet. In such cases, the user can adopt this invention to the broadcast receiver by obtaining the programs to load them onto data processing devices (for example, cellular phones, personal computers, etc.) with the broadcast receivers or broadcast receiving functions each mounted thereon. Therefore, the recording medium is allowed to be one to which the device delivering the program can access.

What is claimed is:

1. A broadcast receiver comprising:
   a channel table configured to store receivable channels for each of a plurality of areas;

channel switches to which receivable channels of an area in which the broadcast receiver is located are assigned;

a receiver configured to receive a broadcast signal of one channel which is designated by one of the channel switches;

an instruction unit configured to issue an instruction for reassigning receivable channels to the channel switches;

a channel selector configured to select one receivable channel in response to the instruction;

an area selector configured to select a candidate area group including at least one area which includes the one receivable channel selected by the channel selector;

a channel acquiring unit configured to acquire, from the channel table, receivable channels for the at least one area in the candidate area group;

a determination unit configured to determine whether or not a broadcast signal of one of the receivable channels acquired by the channel acquiring unit can be received by the receiver;

an updating unit configured to, when the determination unit determines that the broadcast signal of said one of the receivable channels can be received by the receiver, update the candidate area group by removing from the candidate area group an area which does not include said one of the receivable channels; and a channel setting unit configured to, when the updating unit causes there to be only one area in the candidate area group, to set the receivable channels for said only one area to the channel switches.

2. The broadcast receiver according to claim 1, further comprising:

an adjacent area table configured to store a correspondence between each of the areas and at least one area that is adjacent thereto;

wherein the area selector selects the at least one area which includes the one receivable channel selected by the channel selector, and the at least one area that is adjacent thereto according to the adjacent area table, for inclusion in the candidate area group.

3. The broadcast receiver according to claim 1, further comprising an issuing unit configured to issue an alarm when no area remains in the candidate area group updated by the updating unit.

4. The broadcast receiver according to claim 1, wherein the channel acquiring unit removes the one receivable channel selected by the channel selector from the from the receivable channels acquired from the channel table.

5. The broadcast receiver according to claim 1, wherein the instruction unit is configured to issue the instruction in response to an operation of a user operable switch.

6. The broadcast receiver according to claim 1, wherein the instruction unit comprises:

a determination unit configured to determine whether or not a broadcast signal of a channel designated by one of the channel switches can be received by the receiver; and an issuing unit configured to issue the instruction when it is determined that the broadcast signal of the channel designated by the one of the channel switches cannot be received by the receiver.

7. The broadcast receiver according to claim 6, wherein the issuing unit comprises:

a channel extracting unit configured to extract another receivable channel designated by another of the channel switches when it is determined that the broadcast signal of the channel designated by the one of the channel switches cannot be received by the receiver;

an adjacent area specifying unit configured to specify all adjacent areas of the area for which the receivable channels are assigned to the channel switches;

a determination unit configured to determine whether or not all broadcast signals of all channels which are receivable in each of the adjacent areas specified by the adjacent area specifying unit can be received by the receiver; and an instruction issuing unit configured to issue the instruction when the determining unit determines, with respect to at least two areas, that all broadcast signals of all channels which are receivable in the area can be received by the receiver.

8. The broadcast receiver according to claim 1, wherein the receiver comprises two receivers, one of which receives a broadcast signal of a channel specified by the channel switches, and the other of which receives a broadcast signal of one of the receivable channels acquired by the channel acquiring unit.

9. The broadcast receiver according to claim 1, further comprising:

a group table configured to store, for each broadcast station, a relationship between a channel for transmitting a broadcast signal of a broadcast station and an area; and a memory configured to store names of broadcast stations of which broadcast signals are received via channels of the channel switches;

wherein the channel setting unit is configured to detect which broadcast signals of broadcast stations are designated by channels stored in the channel table for said only one area and sets to a channel switch a channel for receiving a broadcast signal of a broadcast station in the detected broadcast stations whose name is stored in the memory.

10. A method for a broadcast receiver, wherein the broadcast receiver includes a channel table configured to store receivable channels for each of a plurality of areas, channel switches to which receivable channels of an area in which the broadcast receiver is located are assigned, and a receiver configured to receive a broadcast signal of one channel which is designated by one of the channel switches, the method comprising:

selecting one receivable channel in response to an instruction for reassigning receivable channels to the channel switches;

selecting a candidate area group including at least one area which includes the one receivable channel;

acquiring, from the channel table, receivable channels for the at least one area in the candidate area group;

determining whether or not a broadcast signal of one of the acquired receivable channels can be received by the receiver;

when it is determined that the broadcast signal of said one of the receivable channels can be received by the receiver, updating the candidate area group by removing from the candidate area group an area which does not include said one of the receivable channels; and when there is only one area in the updated candidate area group, setting the receivable channels for said only one area to the channel switches.

11. The method according to claim 10, wherein the receiver includes an adjacent area table configured to store a correspondence between each of the areas and at least one area that is adjacent thereto; and wherein selecting the candidate area group comprises selecting the at least one area which includes the one receivable channel selected by the channel selector, and selecting the at least one area that is adjacent thereto according to the adjacent area table, for inclusion in the candidate area group.

12. The method according to claim 10, further comprising issuing an alarm when no area remains in the updated candidate area group.

13. The method according to claim 10, further comprising removing the one receivable channel from the receivable channels acquired from the channel table.

14. The method according to claim 10, further comprising issuing the instruction for reassigning receivable channels to the channel switches in response to an operation of a user operable switch of the receiver.

15. The method according to claim 10, further comprising:
   determining whether or not a broadcast signal of a channel designated by one of the channel switches can be received by the receiver; and
   issuing the instruction for reassigning receivable channels to the channel switches when it is determined that the broadcast signal of the channel designated by the one of the channel switches cannot be received by the receiver.

16. The method according to claim 10, further comprising:
   determining whether or not a broadcast signal of a channel designated by one of the channel switches can be received by the receiver;
   extracting another receivable channel designated by another of the channel switches when it is determined that the broadcast signal of the channel designated by the one of the channel switches cannot be received by the receiver;
   specifying all adjacent areas of the area for which the receivable channels are assigned to the channel switches;
   determining whether or not all broadcast signals of all channels which are receivable in each of the specified adjacent areas can be received by the receiver; and
   issuing the instruction for reassigning receivable channels to the channel switches when it is determined, with respect to at least two areas, that all broadcast signals of all channels which are receivable in the area can be received by the receiver.

17. The method according to claim 10, wherein the receiver comprises two receivers, and the method comprises receiving a broadcast signal of a channel specified by the channel switches by one of the receivers, and receiving a broadcast signal of one of the acquired receivable channels by the other of the receivers.

18. The method according to claim 10, wherein the broadcast receiver includes (i) a group table configured to store, for each broadcast station, a relationship between a channel for transmitting a broadcast signal of a broadcast station and an area, and (ii) a memory configured to store names of broadcast stations of which broadcast signals are received via channels of the channel switches; and
   wherein setting the receivable channels for said only one area to the channel switches comprises detecting which broadcast signals of broadcast stations are designated by channels stored in the channel table for said only one area and setting to a channel switch a channel for receiving a broadcast signal of a broadcast station in the detected broadcast stations whose name is stored in the memory.

* * * * *